(12) United States Patent
Pal et al.

(10) Patent No.: US 8,969,924 B2
(45) Date of Patent: Mar. 3, 2015

(54) TRANSISTOR-BASED APPARATUSES, SYSTEMS AND METHODS

(71) Applicant: The Board of Trustees of the Leland Stanford Junior University, Palo Alto, CA (US)

(72) Inventors: Ashish Pal, Stanford, CA (US); Aneesh Nainani, Palo Alto, CA (US); Krishna Chandra Saraswat, Saratoga, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 6 days.

(21) Appl. No.: 13/774,216

(22) Filed: Feb. 22, 2013

(65) Prior Publication Data

US 2013/0307025 A1    Nov. 21, 2013

Related U.S. Application Data

(60) Provisional application No. 61/649,662, filed on May 21, 2012.

(51) Int. Cl.
*H01L 29/78* (2006.01)
*H01L 29/66* (2006.01)
*H01L 27/108* (2006.01)
(Continued)

(52) U.S. Cl.
CPC ...... *H01L 29/7831* (2013.01); *H01L 29/66477* (2013.01); *H01L 29/66484* (2013.01); *H01L 21/845* (2013.01); *H01L 29/7841* (2013.01); *H01L 27/10802* (2013.01); *H01L 27/1211* (2013.01); *H01L 29/267* (2013.01); *H01L 29/7782* (2013.01); *H01L 29/78618* (2013.01); *H01L 29/78696* (2013.01)
USPC ............ 257/224; 257/365; 438/279; 438/300

(58) Field of Classification Search
CPC ...................... H01L 29/66484; H01L 29/7809; H01L 29/7831
USPC ........................... 257/224, 365; 438/279, 300
See application file for complete search history.

(56) References Cited

U.S. PATENT DOCUMENTS 5,461,250 A * 10/1995 Burghartz et al. ............. 257/347
6,306,691 B1 * 10/2001 Koh .............................. 438/149

(Continued)

OTHER PUBLICATIONS

W. Kern and D.A. Puotinen, "Cleaning solutions based on hydrogen peroxide for use in silicon semiconductor technology." RCA Review, 31(6):187, 1970.

(Continued)

*Primary Examiner* — Allan R Wilson
(74) *Attorney, Agent, or Firm* — Crawford Maunu PLLC

(57) ABSTRACT

Various aspects of the invention are directed to memory circuits and their implementation. According to an example embodiment, an apparatus includes a channel region between raised source and drain regions which are configured and arranged with respective bandgap offsets relative to the channel region to confine carriers in the channel region. The apparatus also includes front and back gates respectively separated from the channel region by gate dielectrics. The raised source and drain regions have respective portions laterally adjacent the front gate and adjacent the channel region. Carriers are stored in the channel region via application of voltage(s) to the front and back gates, and relative to bias(es) at the source and drain regions.

16 Claims, 19 Drawing Sheets

(51) Int. Cl.
*H01L 29/778* (2006.01)
*H01L 29/786* (2006.01)
*H01L 21/84* (2006.01)
*H01L 27/12* (2006.01)
*H01L 29/267* (2006.01)

(56) References Cited

U.S. PATENT DOCUMENTS

| | | | |
|---|---|---|---|
| 7,435,987 | B1 | 10/2008 | Chui et al. |
| 7,728,387 | B1 | 6/2010 | Krishnamohan et al. |
| 8,064,239 | B2 | 11/2011 | Ertosun et al. |
| 8,258,498 | B2 * | 9/2012 | Majhi et al. ............... 257/12 |
| 2008/0308802 | A1 | 12/2008 | Honda |
| 2011/0062411 | A1 * | 3/2011 | Bangsaruntip et al. ........... 257/9 |
| 2012/0225525 | A1 * | 9/2012 | Bangsaruntip et al. ....... 438/151 |
| 2012/0306017 | A1 * | 12/2012 | Edelstein et al. ............ 257/365 |

OTHER PUBLICATIONS

E. Kamińska; A. Piotrowska; A. Kamińska and M. Klimkiewicz, "Etching procedures for GaP surfaces", Surface Technology, vol. 12, Issue 2, pp. 205-215, 1981.

H. Kroemer, "Polar-on-nonpolar epitaxy," Journal of Crystal Growth, vol. 81, No. 14, pp. 193-204, 1987.

S. F. Fang; K. Adomi; S. Iyer; H. Morkoc; H. Zabel; C. Choi and N. Otsuka, "Gallium arsenide and other compound semiconductors on silicon" J. Appl. Phys. 68, R31 1990, Oct. 1990.

T. Soga; T. Jimbo and M. Umeno, "Effects of Thickness on Dislocations in GaP on Si Grown by Metalorganic Chemical Vapor Deposition", Jpn. J. Appl. Phys., vol. 32, pp. L767-L769, Jun. 1993.

T. Soga; T. Jimbo and M. Umeno, "Growth and characterization of two-dimensional GaP on Si by metalorganic chemical vapor deposition", Journal of Crystal Growth 146, pp. 554-557, 1995.

T. Soga; T. Jimbo and M. Umeno, "Initial stage of GaP/Si heteroepitaxial growth by metalorganic chemical vapor deposition", Journal of Crystal Growth 163, pp. 165-170, 1996.

J. W. Lee; J. Salzman; D. Emerson; J. R. Shealy and J. M. Ballantyne, "Selective area growth of GaP on Si by MOCVD", Journal of Crystal Growth 172, pp. 53-57, 1997.

M. Sugiyama; K. Kusunoki; Y. Shimogaki; S. Sudo; Y. Nakano; H. Nagamoto; K. Sugawara; K. Tada and H. Komiyama,"Kinetic studies on thermal decomposition of MOVPE sources using fourier transform infrared spectroscopy", Applied Surface Science, vols. 117-118, pp. 746-752, Jun. 2, 1997.

K. Kim; C.-G. Hwang and J. G. Lee, "DRAM technology perspective for gigabit era," Electron Devices, IEEE Transactions on, vol. 45, No. 3, pp. 598-608, Mar. 1998.

S. Okhonin; M. Nagoga; J. Sallese and P. Fazan, "A capacitor-less 1T-DRAM concept," in SOI Conference, 2001 IEEE International, pp. 153-154, 2001.

C. Kuo; T.-J. King and C. Hu, "A capacitorless double-gate DRAM cell design for high density applications," in Electron Devices Meeting, 2002. IEDM '02. Digest. International, pp. 843-846, 2002.

C. Kuo; T.-J. King and C. Hu, "A capacitorless double gate DRAM technology for sub-100-nm embedded and stand-alone memory applications," Electron Devices, IEEE Transactions on, V Mehmet Günhan Ertosun ol. 50, No. 12, pp. 2408-2416, Dec. 2003.

R. Ranica; A. Villaret; C. Fenouillet-Beranger; P. Malinge; P. Mazoyer; P. Masson; D. Delille; C. Charbuillet; P. Candelier and T. Skotnicki, "A capacitor-less DRAM cell on 75nm gate length, 16nm thin fully depleted SOI device for high density embedded memories," in Electron Devices Meeting, 2004. IEDM Technical Digest. IEEE International, pp. 277-280, Dec. 2004.

T. Mizuno; N. Sugiyama; T. Tezuka; Y. Moriyama; S. Nakaharai; T. Maeda and S. Takagi, "High velocity electron injection MOSFETs for ballistic transistors using SiGe/strained-Si heterojunction source structures," Symposium on VLSI Technology, vol., No., pp. 202-203, Jun. 15-17, 2004.

K. Tomioka and S. Adachi "Spectroscopic Characterization of GaP Surfaces Treated in Aqueous HCl Solution", J. Electrochem. Soc. 152, G173, Jan. 24, 2005.

V.K. Dixit; T. Ganguli; T.K. Sharma; R. Kumar; S. Porwal; V. Shukla; A. Ingale; P. Tiwari and A.K. Nath, "Studies on MOVPE growth of GaP epitaxial layer on Si(0 0 1) substrate and effects of annealing", Journal of Crystal Growth 293, pp. 5-13, 2006.

B. Kunert; S. Reinhard; J. Koch; M. Lampalzer; K. Volz and W. Stolz, "First demonstration of electrical injection lasing in the novel dilute nitride Ga(NAsP)/GaP-material system", Phys. stat. sol. (c) 3, 614 2006, Feb. 22, 2006.

B. Kunert; A. Klehr; S. Reinhard; K. Volz and W. Stolz, "Near room temperature electrical injection lasing for dilute nitride Ga(NAsP)/GaP-quantum well structures grown by metal organic vapour phase epitaxy", Electronic Letters 42, Oct. 2006, May 11, 2006.

H. Morota and S. Adachi, "Properties of GaP(001) surfaces chemically treated in NH4OH solution", J. Appl. Phys. 100, 054904, 2006.

T. Krishnamohan; Z. Krivokapic; K. Uchida; Y. Nish and K. C. Saraswat, "High Mobility, Ultra Thin (UT), Strained Ge MOSFETs on Bulk and SOI With Low Band to Band Tunneling (BTBT) Leakage : Experiments," IEEE Trans. Electron Dev. vol. 53, No. 5, pp. 990-999, May 2006.

J. Lei; S. Phan; X. Lu; C. T. Kao; K. Lavu; K. Moraes; K. Tanaka; B. Wood; B. Ninan and S. Gandikota, "Advantage of Siconi Preclean over Wet Clean for Pre Salicide Applications Beyond 65nm Node", IEEE International Symposium on Semiconductor Manufacturing, pp. 393-396, Sep. 25-27, 2006.

M. Bawedin; S. Cristoloveanu, and D. Flandre,"A capacitorless 1T-DRAM on SOI based on dynamic coupling and double-gate operation," Electron Device Letters, IEEE, vol. 29, No. 7, pp. 795-798, Jul. 2008.

Henning Doscher, Thomas Hannappel, Bernadette Kunert, Andreas Beyer, Kerstin Volz, and Wolfgang Stolz, "In situ verification of single-domain III-V on Si(100) growth via metal-organic vapor phase epitaxy" Appl. Phys. Lett. 93, 172110, 2008.

I. Sakata and H. Kawanami, "Band discontinuities in gallium phosphide/crystalline silicon heterojunctions studied by internal photoemission," Appl. Phys. Exp., vol. 1, No. 9, p. 091 201, Jan. 2008.

B. Kunert; I. Németh; S. Reinhard; K. Volz and W. Stolz, "Si (001) surface preparation for the antiphase domain free heteroepitaxial growth of GaP on Si substrate", Thin Solid Films, vol. 517, Issue 1, pp. 140-143, Nov. 3, 2008.

T. Mizuno; Y. Moriyama; T. Tezuka; N. Sugiyama and S. Takagi, "Experimental study of single source-heterojunction MOS transistors (SHOTs) under quasi-ballistic transport," Symposium on VLSI Technology, vol., No., pp. 22-23, Jun. 17-19, 2008.

I. Nemeth; B. Kunert; W. Stolz and K. Volz, "Heteroepitaxy of GaP on Si: Correlation of morphology, anti-phase-domain structure and MOVPE growth conditions", Journal of Crystal Growth, vol. 310, pp. 1595-1601, 2008, Feb. 15, 2008.

K.-W. Song; J.-Y. Kim; H. Kim; H.-W. Chung; H. Kim; K. Kim; H.-W. Park; H. C. Kang; S. Kim; N.-K. Tak; D. Park; W.-S. Kim; Y.-T. Lee; Y. C. Oh; G.-Y. Jin; J. Yoo; K. Oh; C. Kim and W.-S. Lee, "A 31 ns random cycle VCAT-based 4F2 DRAM with enhanced cell efficiency," in Proc. Symp. VLSI Circuits, pp. 132-133, Jun. 2009.

M. Günhan Ertosun and K. C. Saraswat, "Investigation of Capacitorless Double-Gate Single-Transistor DRAM: With and Without Quantum Well," IEEE Trans. Electron Dev. vol. 57, No. 3, pp. 608-613, Mar. 2010.

Günhan Ertosun, "Novel Single Transistor DRAM Technologies", Ph.D. Thesis, Stanford Univ., Jun. 2010.

A. Hubert; M. Bawedin; G. Guegan; S. Cristoloveanu; T. Ernst and O. Faynot, "Experimental comparison of programming mechanisms in 1T-DRAM cells with variable channel length," in Solid-State Device Research Conference (ESSDERC), 2010 Proceedings of the European, pp. 150-153, Sep. 2010.

S. Huang; X. Lu; A. Barnett and R. Opila, "Gallium phosphide epitaxial films for silicon-based multi-junction solar cells grown by liquid phase epitaxy," in Photovoltaic Specialists Conference (PVSC) 2010 35th IEEE, pp. 003 343-003 346, Jun. 2010.

(56) References Cited

OTHER PUBLICATIONS

S. Lee; J. Jang; J. Shin; H. Kim; H. Bae; D.Yun; D. Kim and D. Kim, "A novel superlattice band-gap engineered (SBE) capacitorless DRAM cell with extremely short channel length down to 30 nm," in Memory Workshop (IMW), 2010 IEEE International, pp. 1-4, May 2010.

Y. Takagi; Y. Furukawa; A. Wakahara and H. Kan, "Lattice relaxation process and crystallographic tilt in GaP layers grown on misoriented Si(001)substrates by metalorganic vapor phase epitaxy", Journal of Applied Physics 107, 063506, 2010.

R. Yang; N. Su; P. Bonfanti; J. Nie; J. Ning and T. T. Li, "Advanced in situ pre-ni silicide (siconi) cleaning at 65 nbsp; nm to resolve defects in nisix modules," Journal of Vacuum Science Technology B: Microelectronics and Nanometer Structures, vol. 28, No. 1, pp. 56-61, Jan. 2010.

Z. Lu; N. Collaert; M. Aoulaiche; B. De Wachter; A. De Keersgieter; W. Schwarzenbach; O. Bonnin; K. Bourdelle; B.-Y. Nguyen; C. Mazure; L. Altimime and M. Jurczak, "A novel low-voltage biasing scheme for double gate FBC achieving 5 s retention and 1016 endurance at 85° C.," in IEDM Tech. Dig., pp. 12.3.1-12.3.4, Dec. 2010.

A. Beyer; I. Ne'meth; S. Liebich; J. Ohlmann; W. Stolz and K. Volz, "Influence of crystal polarity on crystal defects in GaP grown on exact Si (001)", Journal of Applied Physics 109, 083529, 2011.

H. Döscher; B. Borkenhagen; G. Lilienkamp; W. Daum and T. Hannappel, "III-V on silicon: Observation of gallium phosphide antiphase disorder by low-energy electron microscopy", Surface Science 605, L38-L41, May 9, 2011.

K. Volz; A. Beyer; W. Witte; J. Ohlmann; I. Nemeth; B. Kunert and W. Stolz "GaP-nucleation on exact Si (0 0 1) substrates for III/V device integration", Journal of Crystal Growth, pp. 37-47, 315, 2011.

N. Hossain; S.J. Sweeney; S. Rogowsky; R. Ostendorf; J. Wagner; S. Liebich; M. Zimprich; K. Volz; B. Kunert and W. Stolz, "Reduced threshold current dilute nitride Ga(NAsP)/GaP quantum well lasers grown by MOVPE," Electronics Letters, vol. 47, No. 16, pp. 931-933, Aug. 2011.

H. Jussila; H, S. Nagarajan; P. Mattila; J. Riikonen; T. Huhtio; M. Sopanen and H. Lipsanen, "Growth and characterization of GaP layers on silicon substrates by metal-organic vapour phase epitaxy", Phys. Status Solidi C, vol. 9, pp. 1607-1609, May 15, 2012.

International Technology Roadmap for Semiconductors. [Online]. Available: http://public.itrs.net/ 2011.

A. Pal; A. Nainani; Z. Ye; X. Bao; E. Sanchez and K. C. Saraswat, "Electrical Characterization of GaP-Silicon Interface for Memory and Transistor Applications", Electron Devices IEEE Transactions, vol. 60, pp. 2238-2245, 2013.

S. A. Parke; J. E. Moon; H-j C. Wann; P. K. Ko and C. Hu, "Design for Suppression of Gate-Induced Drain Leakage in LDD MOSFET's Using a Quasi-Two-Dimensional Analytical Model", IEEE Transactions on Electron Devices, vol. 39, No. 7, (1992).

H. P. Xin; R. J. Welty and C. W. Tu, "GaN0.011P0.989 Red Light-Emitting Diodes Directly Grown on GaP Substrates", Appl. Phys. Lett. 77, 1946 (2000), Aug. 1, 2000.

M. K. Sunkara; S. Sharma; R. Miranda; G. Lian, and E. C. Dickey, "Bulk Synthesis of Silicon Nanowires Using a Low-temperature Vapor-liquid-solid Method", Appl. Phys. Lett. 79, 1546 (2001). Jul. 10, 2001.

J. A. Mandelman; R. H. Dennard; G. B. Bronner; J. K. DeBrosse; R. Divakaruni,;Y. Li and C. J. Radens, "Challenges and Future Directions for the Scaling of Dynamic Random-access Memory (DRAM)", IBM Journal of Research and Development, vol. 46, No. 2.3, pp. 187-212, Mar. 2002.

M. Lundstrom and Z. Ren, "Essential Physics of Carrier Transport in Nanoscale MOSFETs", IEEE Transactions on Electron Devices,vol. 49, No. 1, pp. 133-141, Jan. 2002.

N. Butt and M. Alam, "Scaling Limits of Capacitorless Double Gate DRAM Cell", in Simulation of Semiconductor Processes and Devices, 2006 International Conference, pp. 302-305, Sep. 2006.

H. Morota and S. Adachi, "Properties of GaP(001) Surfaces Treated in Aqueous HF Solutions", J. Appl. Phys. 101, 113518, Jun. 7, 2007.

S-H. Song; J-C. Kim; S-W. Jung and Y-H. Jeong, "Junction Depth Dependence of the Gate Induced Drain Leakage in Shallow Junction Source/Drain-Extension Nano-CMOS", IEICE Transactions on Electronic,vol. E91-C, No. 5, May 2008.

Y. Takano; K. Morizumi; S. Watanabe; H. Masuda; T. Okamoto; K. Noda; S. Fukuda; T. Ozeki; K. Kuwahara; S. Fuke; Y. Furukawa and H. Yonezu, "High-Temperature Growth of GaP on Si Substrates by Metalorganic Vapor Phase Epitaxy", Japanese Journal of Applied Physics 48, (2009), Jan. 2001.

M. G. Ertosun, "Novel Capacitorless Single-Transistor Dram Technologies," Dissertation (May 2010).

T. Mizuno; Y. Moriyama; T. Tezuka; N. Sugiyama and S. Takagi, "Single Source Heterojunction Metal-Oxide-Semiconductor Transistors for Quasi-Ballistic Devices: Optimization of Source Heterostructures and Electron Velocity Characteristics at Low Temperature," Japanese Journal of Applied Physics, vol. 50, (2011).

H. Jussila; S. Nagarajan; T. Huhtio; H. Lipsanen; T. O. Tuomi and M. Sopanen, "Structural Study of GaP Layers on Misoriented Silicon (001) Substrates by Transverse Scan Analysis", J. Appl. Phys. 111, 043518, Feb. 24, 2012.

A. Pal; A. Nainani; S. Gupta and K. C. Saraswat, "Performance Improvement of One-Transistor DRAM by Band Engineering," Electron Device Letters, IEEE, vol. 33, No. 1, pp. 29-31, Jan. 2012.

International Technology Roadmap for Semiconductors. [Online]. Available: http://public.itrs.net/, Dec. 6, 2013.

\* cited by examiner

|  | Source/Drain | Channel | Quantum Well | BOX Insulator | Type |
|---|---|---|---|---|---|
| Material System 1 | GaP/AlP | Silicon | - | SiO2 | A |
| Material System 2 | GaP/AlP | Silicon | SiGe | SiO2 | A |
| Material System 3 | GaAs | Ge | - | SiO2 | A |
| Material System 4 | AlAs | GaAs | - | AlAs | B |
| Material System 4 | InP | $In_{0.53}Ga_{0.47}As$ | - | $In_{0.52}Al_{0.48}As$ | A |
| Material System 5 | InAlAsSb | GaSb | | AlSb | A |

FIG. 5

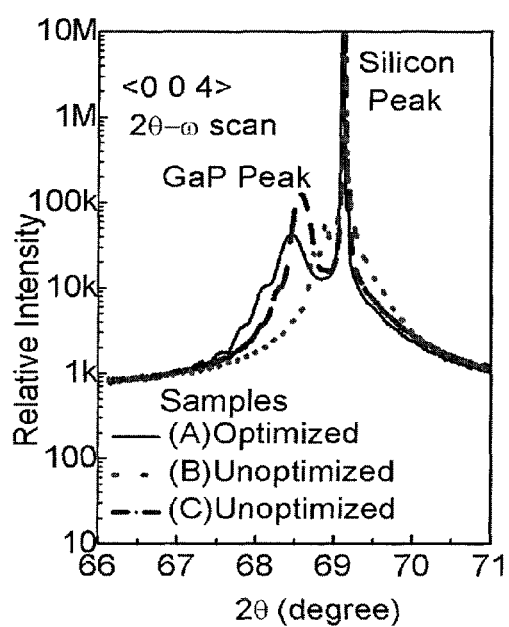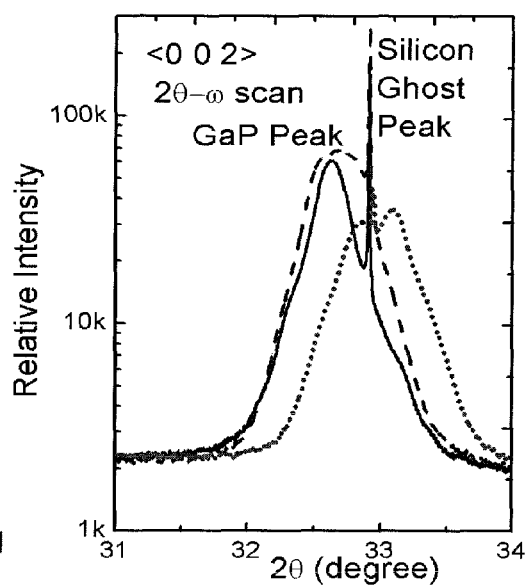
FIG. 15(a)　　　　FIG. 15(b)

US 8,969,924 B2

TRANSISTOR-BASED APPARATUSES, SYSTEMS AND METHODS

RELATED PATENT DOCUMENTS

This patent document claims priority to provisional application Ser. No. 61/649,662, filed May 21, 2012.

FEDERALLY-SPONSORED RESEARCH AND DEVELOPMENT

This invention was made with Government support under contract HR0011-10-3-0002 awarded by the Defense Advanced Research Projects Agency. The Government has certain rights in this invention.

FIELD

The present invention is related to circuits utilizing transistors, and more particularly to transistors having raised source and drain regions with band offsets relative to an underlying channel.

BACKGROUND

With continued scaling of semiconductor devices, various applications are benefiting from and/or requiring the down-scaling of circuits. As part of this effort, 1-transistor 1-capacitor (1T-1C) DRAM circuits have also been scaled down to suit various needs. However, down-scaling has produced problems specific to DRAM cells, such as access transistor leakage and resistance while accessing the stored charge (Qstored) in the capacitor, and difficulties in storing sufficient charge to maintain a good signal to noise ratio while down-scaling capacitor dimensions.

Capacitor-less single-transistor (1T) DRAMs have attracted attention, in part due to the lack of the capacitor and the problems associated with the scaling of the capacitor, and to an ability to achieve high device density. While information is stored as different charge levels at a capacitor in conventional 1T/1C DRAM, the 1T DRAM employs floating body effects within the transistor to store the information. The memory effect in 1T DRAM is caused by excess holes in the floating body, which lower the threshold voltage (VTH) of the transistor. During a read operation, a higher drain current is obtained due to the lower threshold voltage for state "1" compared to state "0," via which the memory state of the device is sensed.

However, implementing 1T-DRAM can be challenging for a variety of applications. For example, retention time can be on the order of 30 µs-10 ms. Upon scaling, this retention time can be reduced as gate length is shortened, and the volume for Qstored is also reduced.

In some implementations, Qstored has been increased using a SiGe quantum well (1T-QW) in the body of a double gate transistor, which can improve the cell performance by increasing the read current. However, such 1T cells with a quantum well can still exhibit a relatively low retention time (e.g., that does not meet International Technology Roadmap for Semiconductors (ITRS) criteria of 64 ms at 85° C.). For instance, during programming, the hole barrier at the source can be insufficient to confine highly energetic holes generated by impact ionization, such that they can easily escape and be collected at the source electrode, hence reducing the sense margin of state '1'. As another example, high diode leakage current through the source/drain diode during a hold state tends to remove all the holes stored in the body and hence reduce the retention time. These and other matters have presented challenges to design and implementation of 1-T DRAM memory circuits, for a variety of applications.

SUMMARY

Various example embodiments are directed to memory circuits and their implementation.

According to an example embodiment, an apparatus includes a channel region between raised source and drain regions which are configured and arranged with respective bandgap offsets relative to the channel region to confine carriers in the channel region. The apparatus also includes front and back gates respectively separated from the channel region by gate dielectrics. The raised source and drain regions have respective portions laterally adjacent the front gate and adjacent the channel region. Carriers are stored in the channel region via application of voltage(s) to the front and back gates, and relative to bias(es) at the source and drain regions.

Another example embodiment is directed to a memory array apparatus having a plurality of carrier confinement regions and, for each carrier confinement region, first and second gate structures and raised source and drain regions. Each carrier confinement region includes first, second and third regions, with the third region being electrically between the first and second regions and having a material exhibiting a bandgap that is different than respective bandgaps of materials of the first and second regions. The carrier confinement regions store data in the form of charge carriers via the respective bandgaps of the first, second and third regions. Each gate structure has a gate electrode and dielectric between the gate electrode and carrier confinement region, and each gate structure is configured and arranged to apply a bias to the carrier confinement region for storing and depleting the charge carriers therein. The raised source and drain regions include at least a portion of the first region adjacent the first gate. The raised drain region includes at least a portion of the second region adjacent the first gate.

Another example embodiment is directed to a method for manufacturing a semiconductor apparatus, as follows. A source-drain material layer is formed on a channel material, and the source-drain material is configured with at least one of a conduction or valence band offset relative to the channel material, in order to confine carriers in the channel region via respective bandgap offsets between the channel region and each of the source and drain regions. The source-drain material layer is patterned or otherwise formed to create separate source and drain regions and expose the channel material. A dielectric layer is formed on the exposed channel material layer, and electrodes are formed on the source region, drain region and gate dielectric.

The above discussion/summary is not intended to describe each embodiment or every implementation of the present disclosure. The figures and detailed description that follow also exemplify various embodiments.

DESCRIPTION OF THE FIGURES

Various example embodiments may be more completely understood in consideration of the following detailed description in connection with the accompanying drawings, in which:

FIG. 5 shows a table exhibiting respective combinations of materials, as may be implemented with channel and source/drain regions in various example embodiments;

FIGS. 15(a) and 15(b) are graphs showing optimization of a MOCVD recipe by X-ray diffraction characterization of GaP film grown on <1 0 0> Silicon;

Figure 1:
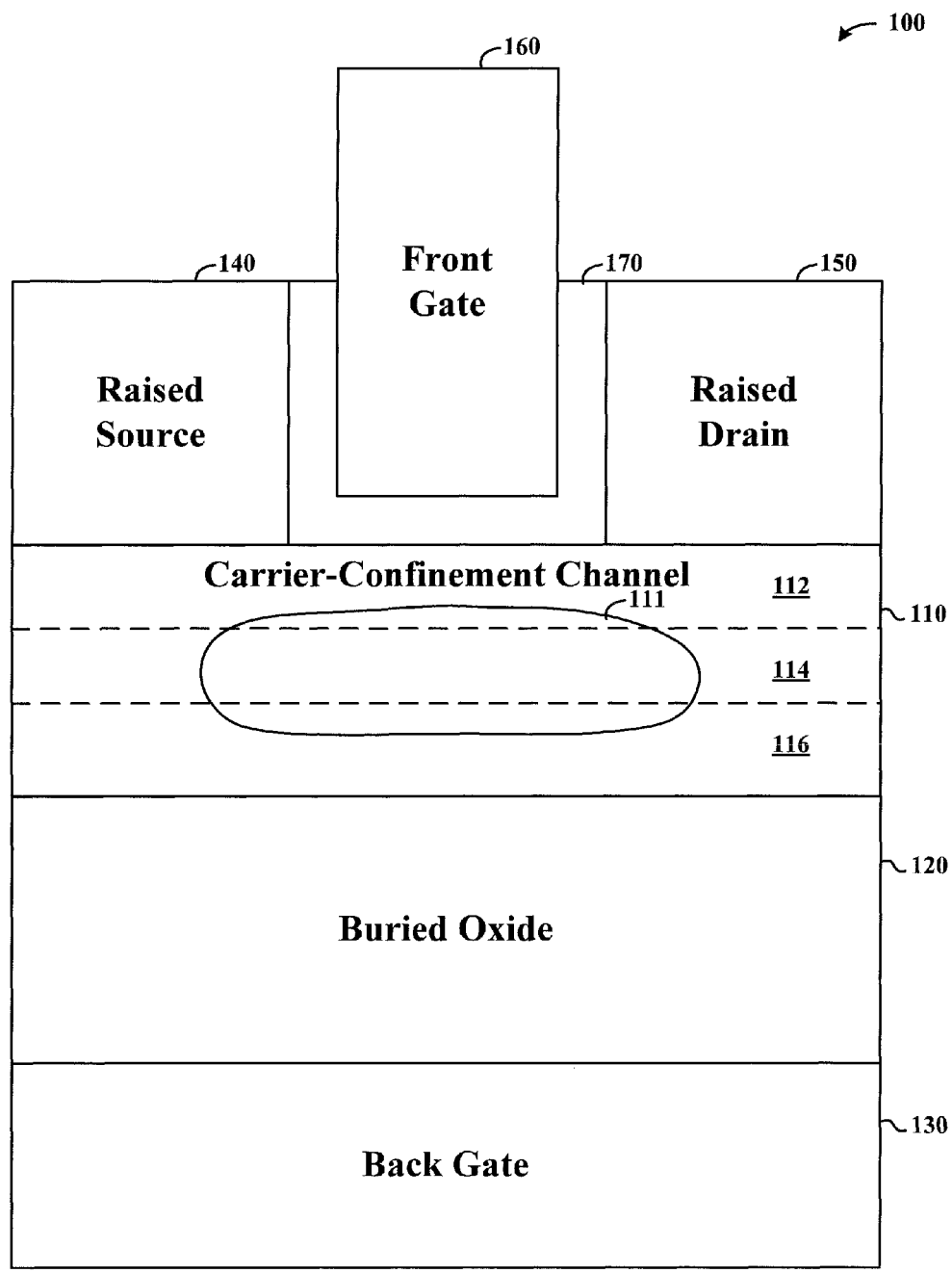
FIG. 1 shows a memory apparatus, in accordance with an example embodiment of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the scope of the invention including aspects defined in the claims.

DETAILED DESCRIPTION

Aspects of the present invention are believed to be applicable to a variety of different types of devices, systems and arrangements involving memory circuits. While the present invention is not necessarily so limited, various aspects of the invention may be appreciated through a discussion of examples using this context.

Various example embodiments are directed to an apparatus having a carrier confinement region configured and arranged with materials having respective bandgaps that facilitate the confinement of carriers for charge storage, as may be applicable to electronic devices such as memory devices. In some embodiments, the carrier confinement region includes first, second and third regions in which the third region is electrically between the first and second regions and has a material exhibiting a bandgap that is different than respective bandgaps of materials of the first and second regions. The carrier confinement region stores data in the form of charge carriers via the respective bandgaps of the first, second and third regions. Such a structure may, for example, follow a Type I heterostructure.

In some implementations, a memory array includes a plurality of memory cells with each memory cell including one of the above-discussed carrier confinement regions. Each cell includes a transistor including the first and second regions as source and drain regions, and the third region as a channel region. One or more gates apply a bias to the third region and, with the application of a bias to one or both source and drain regions, effects the storage and depletion of charge carriers in the third region to effect read, write, erase and hold operations. Such a memory array may, for example, be implemented as a dynamic random access memory cell (DRAM) with charge stored in the third region based upon a threshold voltage of the gate electrode. In a more particular embodiment, a memory array as discussed above is formed on a wafer die having a Central Processing Unit (CPU).

FIG. 1 shows an apparatus 100 operating using a band offset to confine carriers, in accordance with another example embodiment of the present invention. The apparatus 100 includes a carrier-confinement channel region 110 on an insulating layer 120, shown by way of example as a buried oxide layer, which separates the channel region from a back gate 130. Raised source and drain regions 140 and 150 are on the channel region 110, and a front gate 160 is between the source and drain regions, and over the channel region. A gate insulator 170 insulates the front gate respectively from the channel region 110 and the raised source and drain regions 140 and 150.

The channel region 110 includes a low bandgap semiconductor material, such as silicon or silicon germanium, which is responsive to a relatively low programming voltage for storing charge carriers therein, as facilitated via the initiation of impact ionization at low drain voltage. The raised source (140) and drain (150) regions are made of high-bandgap semiconductor material. In some implementations, the high-bandgap semiconductor material has either a valence band offset or conduction band offset from the semiconductor material in the channel region 110, and may be lattice-matched with the semiconductor material in the channel region 110 to mitigate interface defects. The respective bandgap offsets of the channel region 110 and raised source and drain regions 140 and 150 confine carriers in the channel region, as represented by way of example at region 111.

In some embodiments, the channel region 110 includes two or more layers, including a quantum well. FIG. 1 shows one such example embodiment, with dashed lines defining respective layers 112, 114 and 116 in which the middle layer 114 is of a material having either a conduction band offset or valence band offset relative to the materials in layers 112 and 116. The respective layers and the corresponding conduction or valance band offsets between layers 112 and 114, and 116 and 114, confine carriers within the middle layer 114. In some implementations, these respective layers 112, 114 and 116 are also lattice-matched with each other.

This carrier confinement facilitates the aforesaid storage of charge carriers, which can be subsequently accessed/read out as a memory state of the device in the context of a one-transistor DRAM type of memory cell (and as may be implemented as further discussed herein). For instance, valance band offsets can be used to store hole-type charge carriers, and conduction band offsets can be used to store electron-type charge carriers. In some implementations, each of the source and drain regions 140 and 150 exhibits a conductance band that is offset from a conductance band of the channel region, and the source, drain and channel regions store electron-based charge carriers in the channel region via the respective conductance band offset. In other implementations, each of the source and drain regions 140 and 150 exhibit a valence band that is offset from a valence band of the channel region and a conductance band that is offset from a conductance band of the channel region, with the channel region 110 having a material with a bandgap that is smaller than a bandgap of the respective source and drain regions. The source, drain and channel regions store hole-based charge carriers in the channel region via the valence and band offset, and store electron-based charge carriers in the channel region via the conductance band offset. In certain implementations, the layer 114 is implemented to exhibit one or both of the valance and conductance band offsets, relative to one or both of layers 112 and 116.

Figure 2:
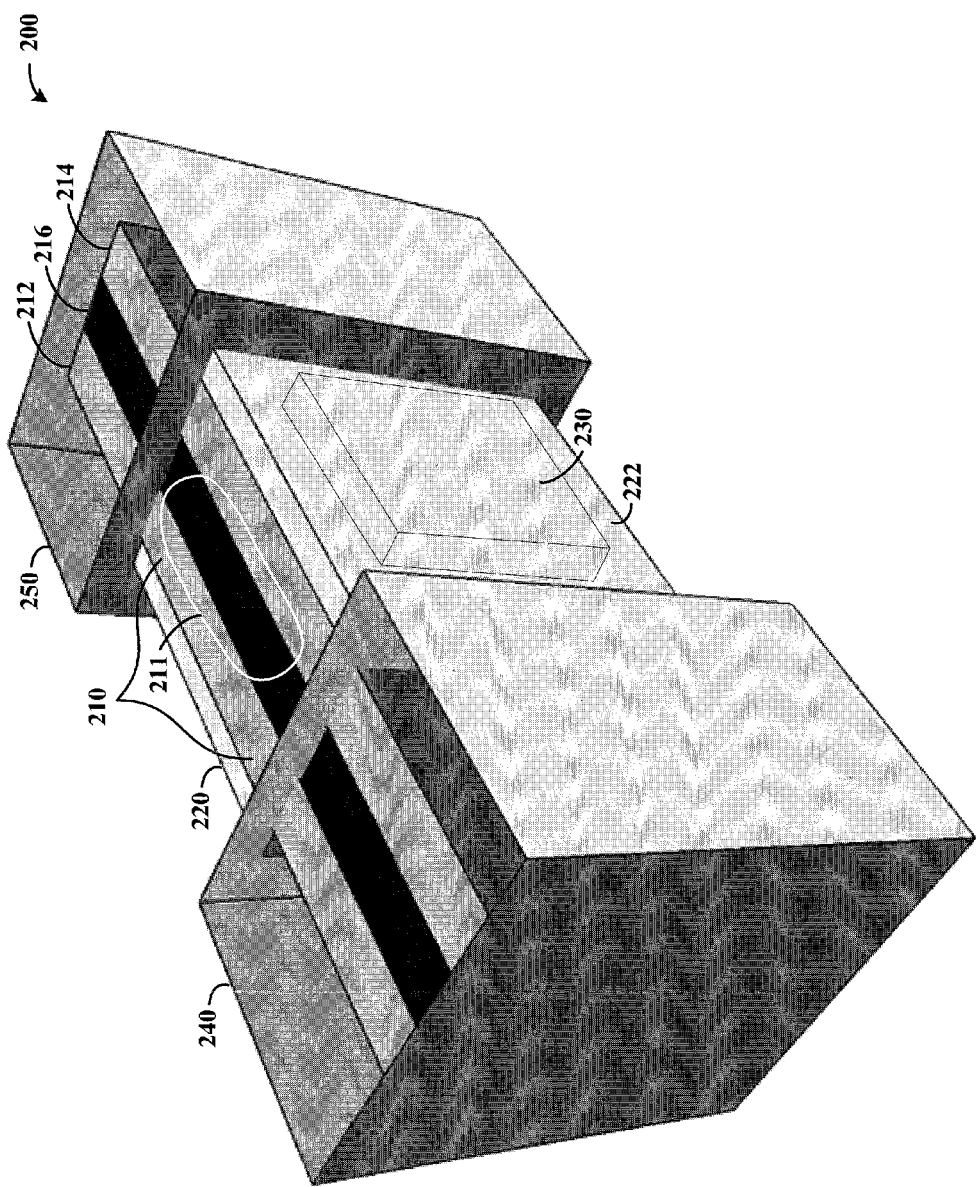
FIG. 2 shows a cut-away three-dimensional view of a FinFET type structure, in accordance with another example embodiment of the present invention.

FIG. 2 shows a cut-away three-dimensional view of a FinFET type structure 200, in accordance with another example embodiment of the present invention. The structure 200 includes a fin-type carrier-confinement channel region 210 having a low-bandgap semiconductor material, and in some embodiments, includes layers 212 and 214 of such a low-bandgap material, with a center quantum storage-type material 216 having a valance-band or conduction-band offset relative to the low-bandgap material, which respectively facilitate a carrier confinement region as represented at 211. Insulating layers 220 and 222 respectively face opposing sides of the channel region 210 (212 and 216, when implemented with material 216). By way of example, a front-gate structure 230 is shown facing the channel region, separated by insulating layer 222. In some implementations, a similar back-gate structure is opposite the front-gate structure 230, on insulating layer 220 (e.g., hidden from view as shown). The insulating layers 220 and 222 may, for example, include one or more of $SiO_2$ and a high-K material. In various implementations, such gate structures are wrapped around a portion of the fin-type channel region 210 and/or implemented with gate materials of different thicknesses (e.g., much thicker than the insulating layers 220 and 222).

Raised source and drain regions 250 and 240 are connected via the channel region 210, which is shown by way of example (and cut-away view) as extending into the source and drain regions. Other embodiments are directed to such an arrangement in which the channel region 210 extends to a lesser distance, or not at all, into the source and drain regions. The source and drain regions 250 and 240 include a high-bandgap semiconductor material that, as shown, is wrapped around the end portions of the fin-type channel region 210. Where the three-material structure, including the low-bandgap material 212 and 214 separated by material 216, is used as the channel region 210, material 216 has a bandgap that is higher than that of material 212 and 214, but lower than the bandgap of the source and drain regions 250 and 240.

Figures 3, 4:
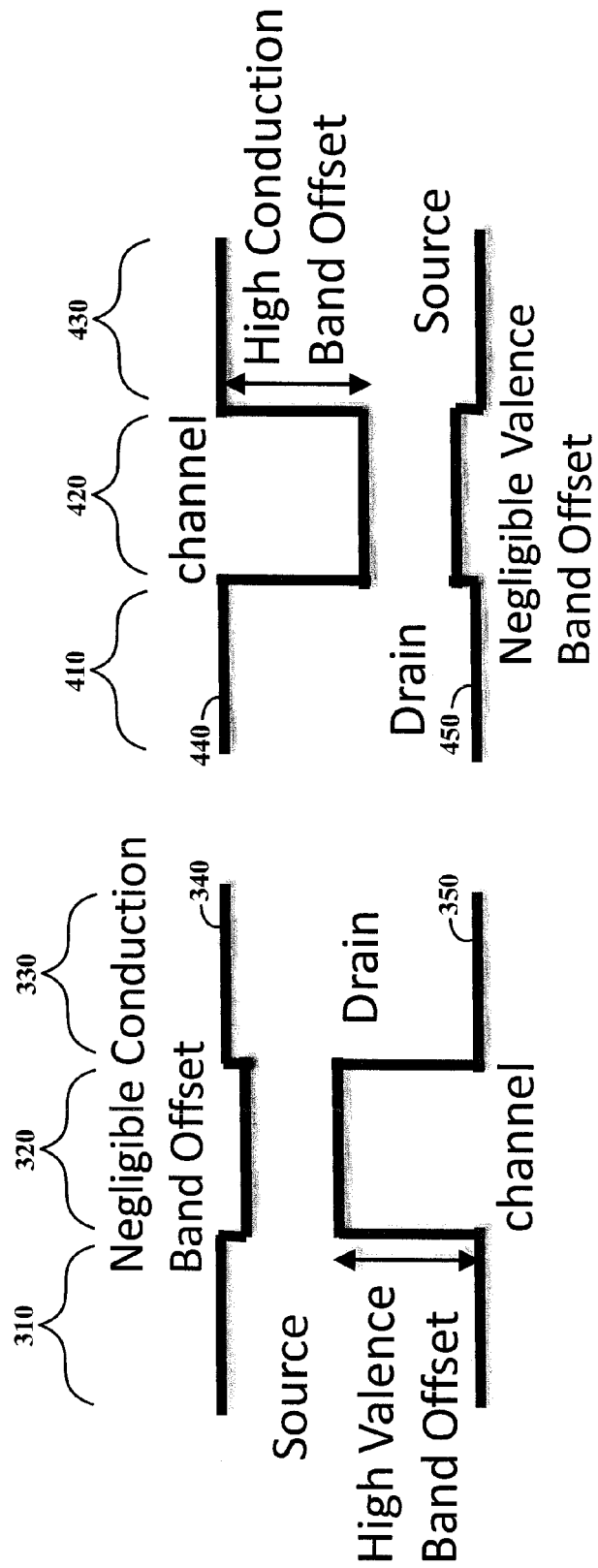
FIG. 3 shows example band lineups of channel and source/drain regions of devices implemented in accordance with one or more example embodiments.
FIG. 4 shows other example band lineups of channel and source/drain regions of devices implemented in accordance with one or more example embodiments.
Figure 6:
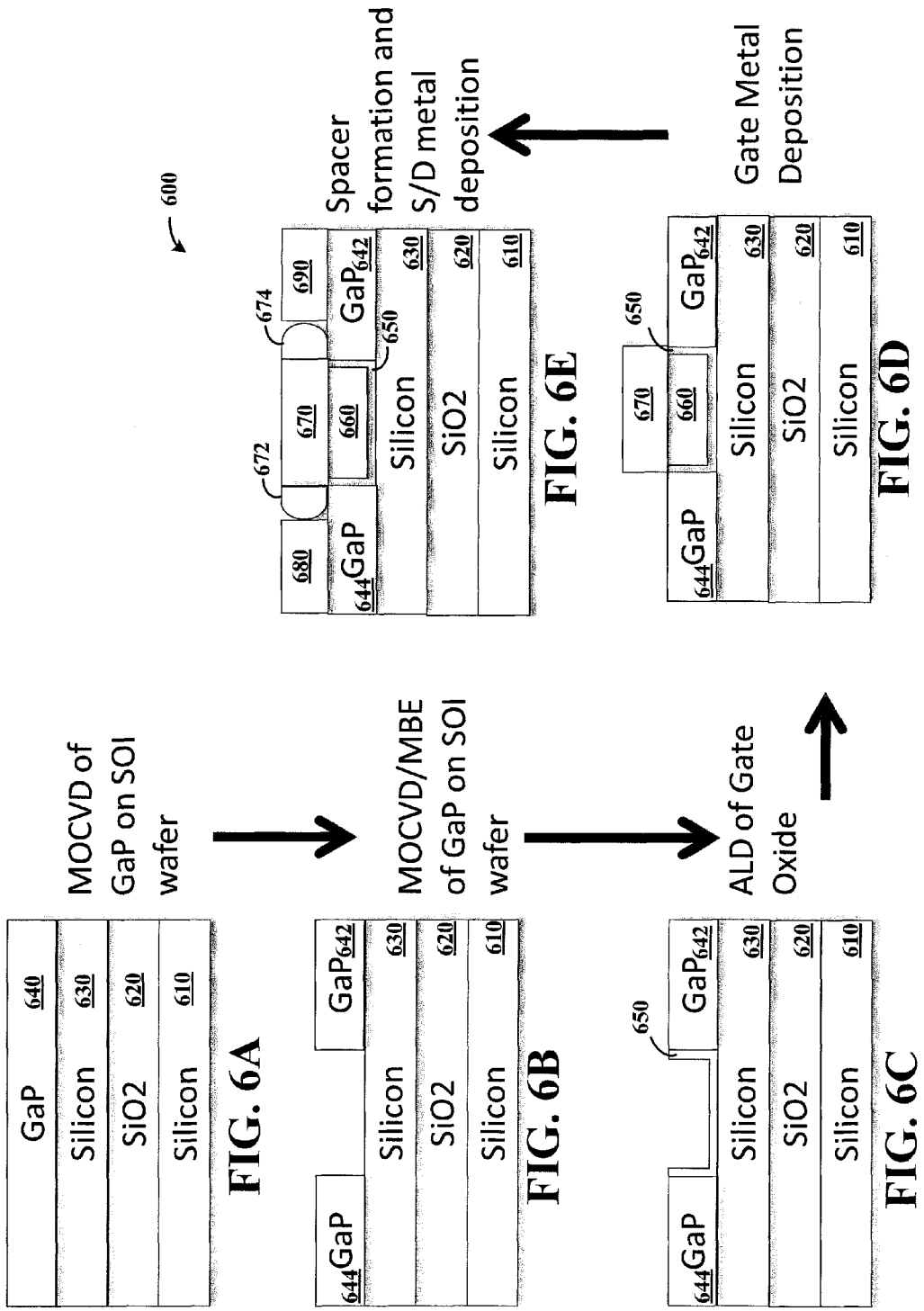
FIG. 6A-FIG. 6E show a one-transistor memory cell at various stages of manufacture, in accordance with one or more example embodiments.

FIGS. 3 and 4 show example band lineups of channel and source/drain regions of devices implemented in accordance with one or more example embodiments. Beginning with FIG. 3, plots of a conduction band 340 and valence band 350 are shown for respective source, channel and drain regions 310, 320 and 330, in accordance with an example embodiment involving a hole-based storage approach. The conduction band 340 values at the channel 320 and source/drain 310/330 are similar and/or exhibit a band offset that may be negligible. The valence band 350 value at the channel 320 is significantly offset, relative to the valence band at the source 310 and drain 330. This valence band offset is implemented to store hole-based charge carriers.

Turning to FIG. 4, plots of a conduction band 440 and valence band 450 are shown for respective source, channel and drain regions 410, 420 and 430, in accordance with an example embodiment involving an electron-based storage approach. The valence band 450 values at the channel 420 and source/drain 410/430 are similar and/or exhibit a band offset that may be negligible. The conduction band 440 value at the channel 420 is significantly offset, relative to the valence band at the source 410 and drain 430. This valence band offset is implemented to store electron-based charge carriers.

The materials implemented with the channel regions and source/drain regions as discussed herein are selected and implemented in accordance with available materials, desired properties (e.g., conduction or valence-band offset per the above discussion of FIGS. 3 and 4), or to suit particular applications. In some embodiments, the materials used for the drain/source and channel regions have similar lattice constants, and either a high conduction band offset or valence band offset. Accordingly, various embodiments are directed to apparatuses as discussed herein with source and/or drain regions having materials including one or more of a variety of source, drain and channel materials as discussed herein. Some example combinations of source/drain and channel materials include (listing channel material first, followed by source/drain material): layers of silicon with a silicon germanium ($Si_{1-x}Ge_x$, x between 0 and 1) therebetween and gallium phosphide (GaP) material that forms an interface with the silicon material; silicon and aluminum phosphide (AlP) material; layers of silicon with silicon germanium ($Si_{1-x}Ge_x$, x between 0 and 1) therebetween and aluminum phosphide (AlP); silicon and aluminum gallium phosphide ($Al_xGa_{1-x}P$, x between 0 and 1) material; silicon layers with silicon germanium ($Si_{1-x}Ge_x$, x between 0 and 0.4) therebetween and aluminum gallium phosphide ($Al_yGa_{1-y}P$, y between from 0 and 1); germanium and gallium arsenide (GaAs); gallium arsenide (GaAs) and aluminum arsenide (AlAs); indium gallium arsenide (InGaAs) and indium phosphide (InP); and gallium antimonide (GaSb) and indium aluminum arsenide antimonide (InAlAsSb). These channel materials may, for example, be implemented across a channel or with a combination of materials such as 112, 114 and 116 as shown in FIG. 1 (e.g., with 112 and 116 being silicon-based and layer 114 including one or more such materials).

FIG. 5 shows a table exhibiting respective combinations of materials, as may be implemented with channel and source/drain regions in various example embodiments. For example, as GaP and AlP both have lattice constants very close to silicon, and both GaP and AlP have a high valence band offset from Silicon (e.g., good for storing holes efficiently as discussed above) and the conduction band offset is not that high (does not offer too high resistance at channel-drain junction), such materials are implemented with embodiments consistent with material systems 1 and 2 as shown in FIG. 5, with or without a quantum well inside the channel. Other material systems as shown and implemented with various embodiments include GaAs/Ge, AlAs/GaAs, InAlAsSb/GaSb and InP/In$_{0.53}$Ga$_{0.7}$As.

Referring back to FIG. 1, one or more of a variety of materials as shown in FIG. 5 or otherwise discussed herein, are implemented with the respective channel and source/drain regions (110, 140, 150), in connection with various example embodiments. In one embodiment, the source/drain regions 140 and 150 include a GaP material, and the channel region 110 includes a silicon material. This combination exhibits a high valence band offset (~1 eV) and small conduction band offset (~0.3 eV), with a resulting bandgap in the channel region of about 1.12 eV and in the source/drain regions of about 2.26 eV. This offset facilitates the storage of holes inside the channel region. In certain implementations, the GaP/Si system also facilitates the storage of electrons, via the conduction band offset between the respective materials. The lattice mismatch between GaP and silicon is only about 0.37%, which can facilitate the growth of GaP on silicon. In connection with these embodiments, it has been discovered that, due to effective confinement of carriers inside the channel by valence/conduction band offset at the source and drain regions, the stored carrier density is higher for the devices having a source/drain material with a higher bandgap (such as with GaP/Si devices). It has further been discovered that, by raising the source and drain regions above a channel region upon which a gate stack rests, a higher volume for storing charge inside the body can be obtained. This higher volume can be implemented, for example, via bandgap-based confinement with respect to material in the raised portion of the source and drain regions, relative to the channel.

Accordingly, using one or more approaches/apparatuses as discussed herein, higher concentrations of hole-based carriers or electron-based carriers (e.g., according to valance or conduction band offsets) can be stored inside the channel relative, for example, to a single material source-drain-channel based device (e.g., up to four orders of magnitude higher). In addition, memory retention time can be enhanced in memory applications involving the storage of the charge carriers, and read sensing current is also enhanced via higher concentration of charged carriers inside the channel. Such approaches may also facilitate device scalability, higher band to band tunneling distance in the hold state (which leads to lower tunneling current and desirable '0' state retention time), and/or higher hold voltage during a hold state to exhibit a better '1' state retention time. In addition, certain embodiments are directed to hole storage aspects that facilitate high read sensing current (~150-250 uA/um at 27° C. after 0.5 sec of programming), or to electron storage aspects that facilitate high read sensing current (~50 uA/um at 27° C. after 0.5 sec of programming).

Referring again to FIG. 1, in another example embodiment, the channel region 110 is implemented with respective materials as shown at 112, 114 and 116, with silicon at 112 and 116 and a SiGe quantum well at 114. These respective materials may be used with one or more source/drain materials such as discussed above. A material such as GaP is used with the source and drain regions 140 and 150, and facilitates a bandgap offset relative to the channel as discussed above. In some implementations, the SiGe quantum well includes a material including Si$_{1-x}$Ge$_x$ in which x is between 0 and 1, or between 0 and 0.4, and which can be implemented with source/drain regions having aluminum gallium phosphide (Al$_y$Ga$_{1-y}$P, y varying from 0 to 1) and/or with materials as discussed above. The SiGe quantum well (at 114) exhibits a valence band offset of about 0.17 eV relative to the silicon layers 112 and 116, which effects a further offset relative to that between the silicon and GaP source/drain regions 140 and 150. This additional offset serves to further concentrate stored charge carriers in the channel, which together with the offset provided via the source/drain regions (e.g., GaP), serves to facilitate a high read current and long read time (e.g., even after 0.5 sec, the read value is sufficient to distinguish between logic state '1' and logic state '0' as represented by the storage of charge carriers). In addition, operable read currents can be achieved via such an offset as implemented with gate lengths of about 45 nm or less (e.g., 50-60 uA/um, up to 90 μA/μm with quantum well), and in some implementations gate lengths of about 15 nm or less (e.g., 6-20 μA/μm, and up to 40 μA/μm with quantum well). These short-gate devices maintain a read current level that is sufficient to distinguish between a logic state '1' and logic state '0' level with respect to the charge carriers stored therein. Moreover, tunneling distance at the source/drain and channel interface (e.g., GaP/Si) is increased via the band offset, which is used to implement a high holding voltage and therein facilitate retention time.

FIG. 6A-FIG. 6E show a one-transistor memory cell 600 at various stages of manufacture, in accordance with one or more example embodiments. While the figures show a single transistor, the approaches shown herein may be implemented in connection with the formation of a plurality of such transistors, such as may be implemented in an array of 1T DRAM memory cells.

Beginning with FIG. 6A, a wafer is provided having a silicon-on-insulator (SOI) structure including a silicon material 610 (e.g., bulk silicon), an insulator 620 (represented by way of example as including SiO$_2$), and another silicon material layer 630 (e.g., an active layer). A gallium phosphide (GaP) layer 640 is formed on the silicon layer 630, which is represented in FIG. 6A by way of example as being carried out via metal organic chemical vapor deposition (MOCVD) upon an SOI wafer. The GaP layer 640 is formed using other approaches in different implementations, such as by using molecular beam epitaxy (MBE).

At FIG. 6B, the GaP layer 640 has been patterned, forming separated GaP regions 642 and 644, as raised source and drain regions. In FIG. 6C, a gate dielectric 650 has been deposited, shown by way of example as being carried out via atomic layer deposition (ALD). At FIG. 6D, a conductive gate material 660 as well as a gate contact 670 have been formed respectively in and over the gate dielectric 650. After formation of the gate contact 670, insulating spacers 672 and 674 are formed adjacent the contact, followed by drain contact 680 and source contact 690 as shown in FIG. 6E. The resulting raised source-drain GaP 1T-DRAM structure has a bandgap offset realized via the raised source/drain regions 642/644 and the silicon material layer (channel region) 630. A similar approach is carried out in other embodiments, in which a quantum well is formed in the silicon material layer 630, using a layered structure such as shown in FIG. 1 (112/114/116).

Figure 7:
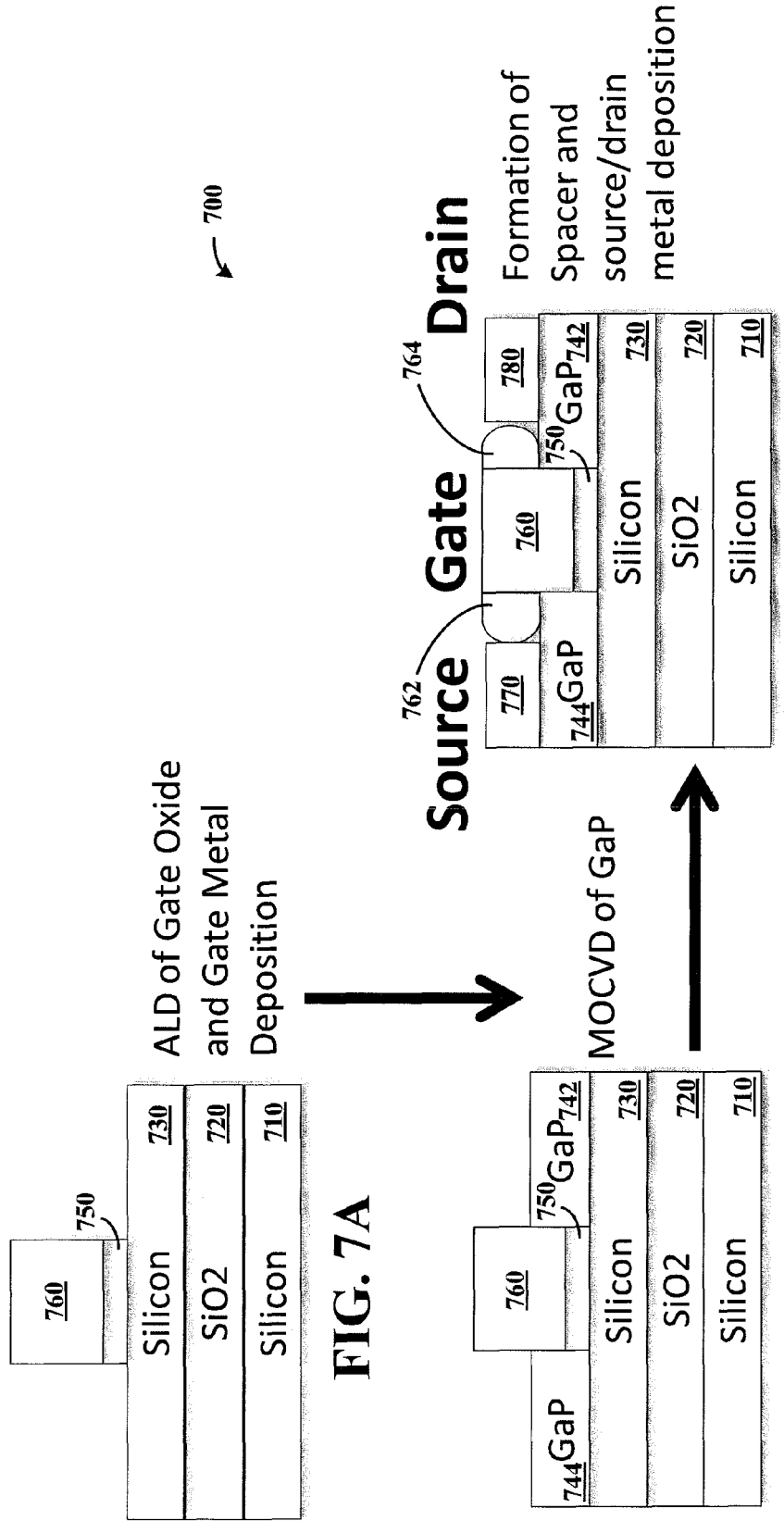
FIG. 7A-FIG. 7C show another one-transistor memory cell at various stages of manufacture, in accordance with one or more example embodiments.

FIG. 7A-FIG. 7C show another one-transistor memory cell 700 at various stages of manufacture, in accordance with one or more example embodiments. Beginning with FIG. 7A, a wafer is provided, also having a silicon-on-insulator (SOI) structure by way of example and including a silicon material 710 (e.g., bulk silicon), an insulator 720 (represented by way of example as including SiO$_2$), and an active silicon material layer 730. A gate dielectric 750 has been formed on the active silicon layer 730, and a gate 760 has been formed on the gate dielectric. By way of example, the gate oxide and gate metal are shown as having been formed via atomic layer deposition (ALD).

In FIG. 7B, GaP raised source and drain regions 742 and 744 have been formed adjacent the gate dielectric 750 and gate 760, and on the active silicon layer 730. By way of example, FIG. 7B represents this process as a MOCVD process, as discussed above. The source and drain region formation is effected using characteristics of GaP with regard to selectivity between silicon and oxides, with GaP growth taking place in the area not covered by the gate dielectric 750. After the source and drain regions have been formed, gate spacers 762 and 764 are formed adjacent the gate, and the drain contact 770 and source contact 780 are formed on the respective source and drain regions 742 and 744, as shown in FIG. 7C.

In many implementations, the process flow with regard to the formation of 1T-DRAM memory cells as described herein is integrated within a fabrication process of logic transistors, using higher bandgap material at the source/drain. Various approaches are directed to such implementations with lowering memory latency and increasing performance.

Figure 8:
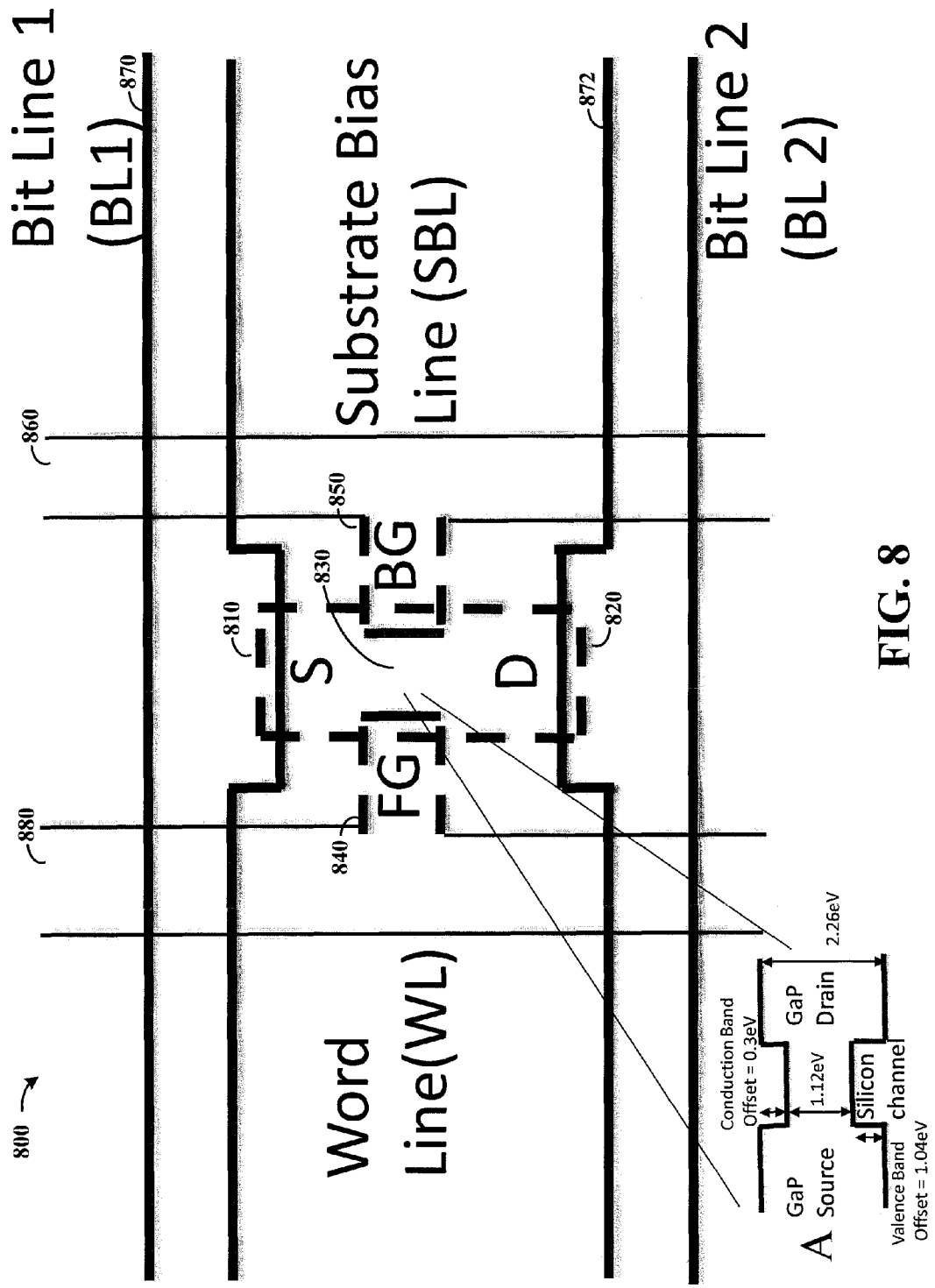
FIG. 8 shows a memory cell with a channel and source/drain bandgap offset, in accordance with another example embodiment of the present invention.

FIG. 8 shows a memory cell 800 with a channel and source/drain bandgap offset, in accordance with another example embodiment of the present invention. The memory cell 800 includes source 810, drain 820 and channel 830, respectively having a bandgap offset such as shown in the inset A. A front gate 840 and back gate 850 respectively apply a bias to the channel region 830 for controlling a state of memory therein (stored charge carriers) via the bandgap, and for reading the stored state.

A substrate bias line 860 is connected to the back gate 850, first and second bit lines 870 and 872 are respectively connected to the source 810 and drain 820, and a word line 880 is connected to the front gate 840. In some implementations, the bias line 860 is common for all cells in a block (e.g., with the cell 800 implemented in an array with a plurality of such cells) such that a common erase can be carried out for all the cells in a block. In other implementations, the bias line 860 is coupled to an individual cell (800), such as with a FinFET type of application as shown in FIG. 2, to facilitate a separate erase (and more control) of each cell. The cell 800 can also be implemented without a capacitor, and the feature size is as low as $4F^2$ for various implementations, facilitating packing density and small area for 1T DRAM.

Figure 9:
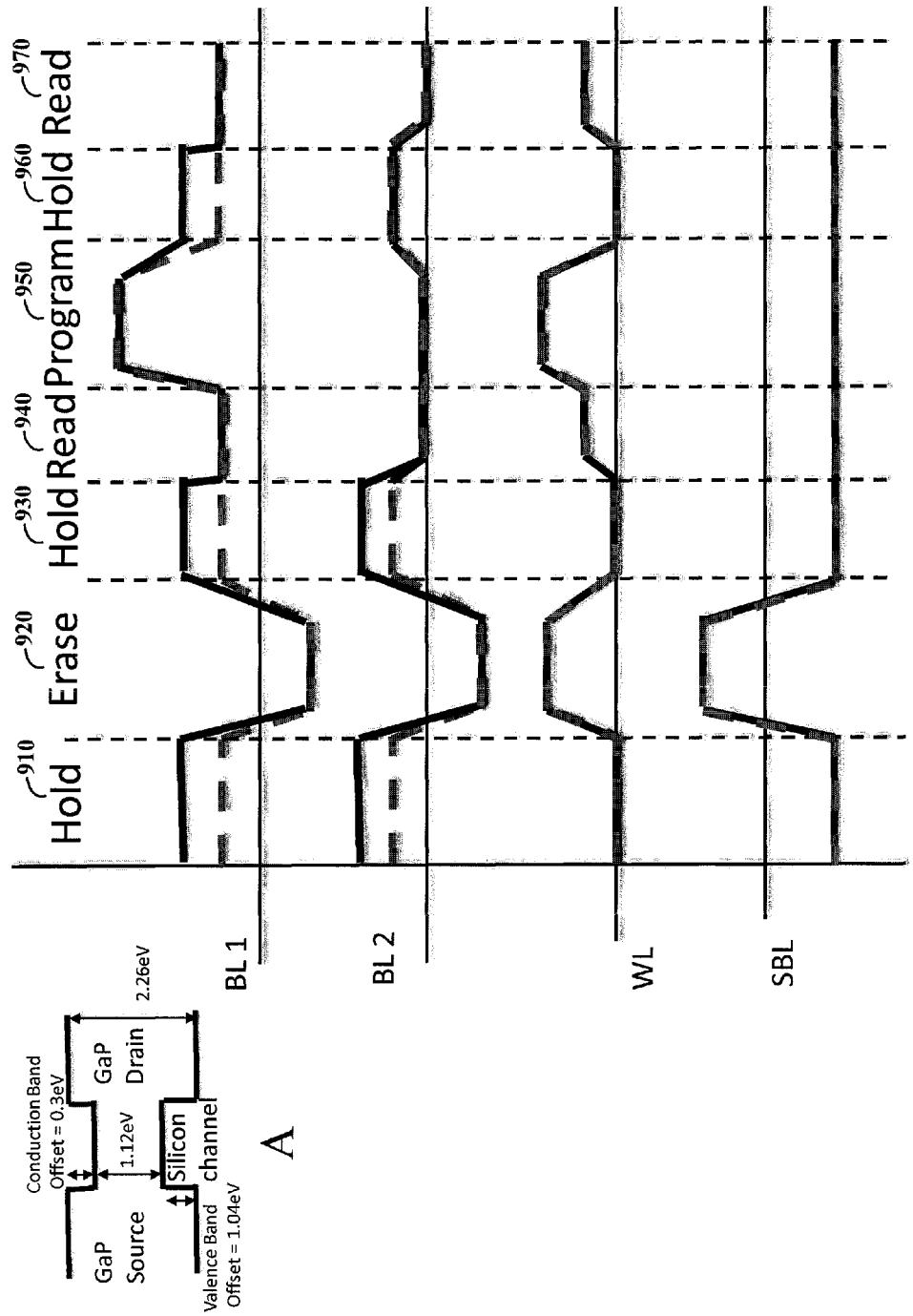
FIG. 9 shows a timing diagram for a memory cell having a channel and source/drain bandgap offset, in accordance with another example embodiment of the present invention.

FIG. 9 shows a timing diagram for a memory cell having a channel and source/drain bandgap offset, in accordance with another example embodiment of the present invention. By way of example, the timing diagram in FIG. 9 is discussed as implemented with the memory cell 800 shown in FIG. 8. Different voltage levels are shown for each operation in the cell, for storing holes inside the body using a bandgap offset as discussed herein and shown in inset A. During the hold states (910, 930, 960), the substrate is given a negative voltage to attract the holes to the back interface and both the bitlines 870 and 872 are set to some positive voltage to hold the holes. This hold voltage is limited by band-to-band tunneling that happens at source-channel and drain-channel interfaces. Since more carriers are effectively confined inside the transistor body for 1T-DRAM with heterostructures, the same retention time can be attained with a lower hold voltage than conventional 1T-DRAM.

Erasing is carried out at 920 by applying a negative voltage to the bitlines 870 and 872, and a positive voltage to the word line 880 and the substrate line 860 to remove all the stored carriers inside the body. The reading of the logic level at 940 (and 970) is carried out by applying a small positive voltage to one of the bit lines 870 and 872 while maintaining a negative voltage at the substrate bias line 860. Programming is carried out at 950 by applying a high level to the bit-lines 870 and 872 and word line 880, which turns the front gate 840 on and starts impact ionization, while applying the negative bias to the back gate 850 to attract generated holes towards the back interface.

Various embodiments are directed to timing aspects involving the operation of a memory cell as discussed herein, with a gate, back gate, source and drain operated as shown in Table 1 below for respective memory read, write, hold and erase functions. These operational aspects may, for example, be implemented with the devices as shown in one or more of the figures, such as the device 100 in FIG. 1.

TABLE 1

| Operation | Gate | BG | S | D |
|---|---|---|---|---|
| write "1" - | 1.0 | −1.0 | 0 | 2.5 |
| read | 0 | −1.0 | 0 | 0.5 |
| hold | 0 | −1.0 | 0.5 | 0.5 |
| erase | 0 | 1.0 | −1.5 | −1.5 |

Figure 10:
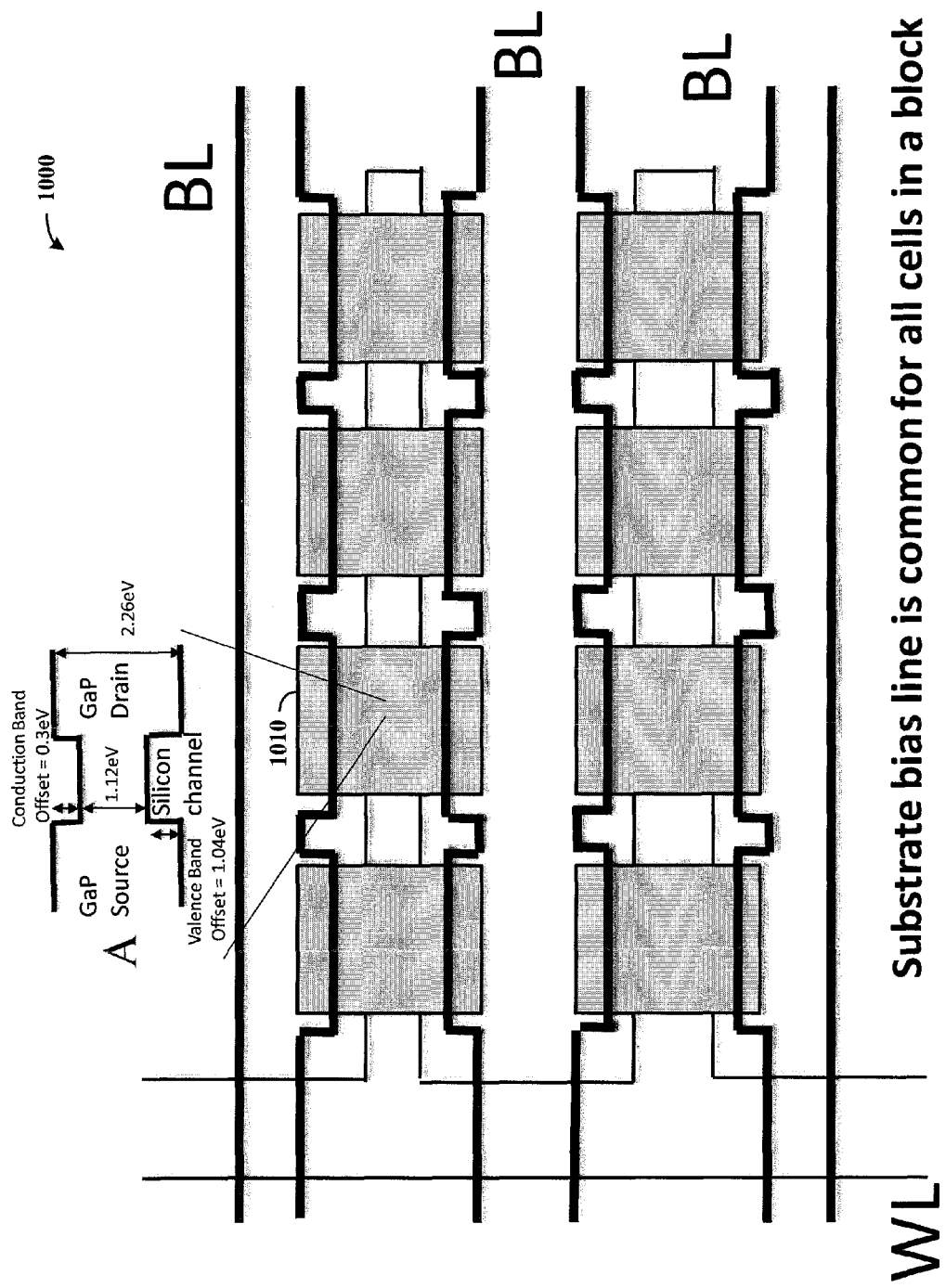
FIG. 10 shows a 1-T DRAM memory array, each memory cell in the array including a transistor having a channel and source/drain bandgap offset, in accordance with another example embodiment of the present invention.

FIG. 10 shows a 1-T DRAM memory array 1000, with a plurality of memory cells including cell 1010, in accordance with another example embodiment of the present invention. Each memory cell in the array includes a transistor having a channel and source/drain bandgap offset, as represented in the inset A. In various implementations, the cell 1010 (and others as shown) may be implemented in accordance with one or more memory cells as described herein, such as those shown in FIGS. 1, 2, and described with FIGS. 8 and 9.

Figure 11:
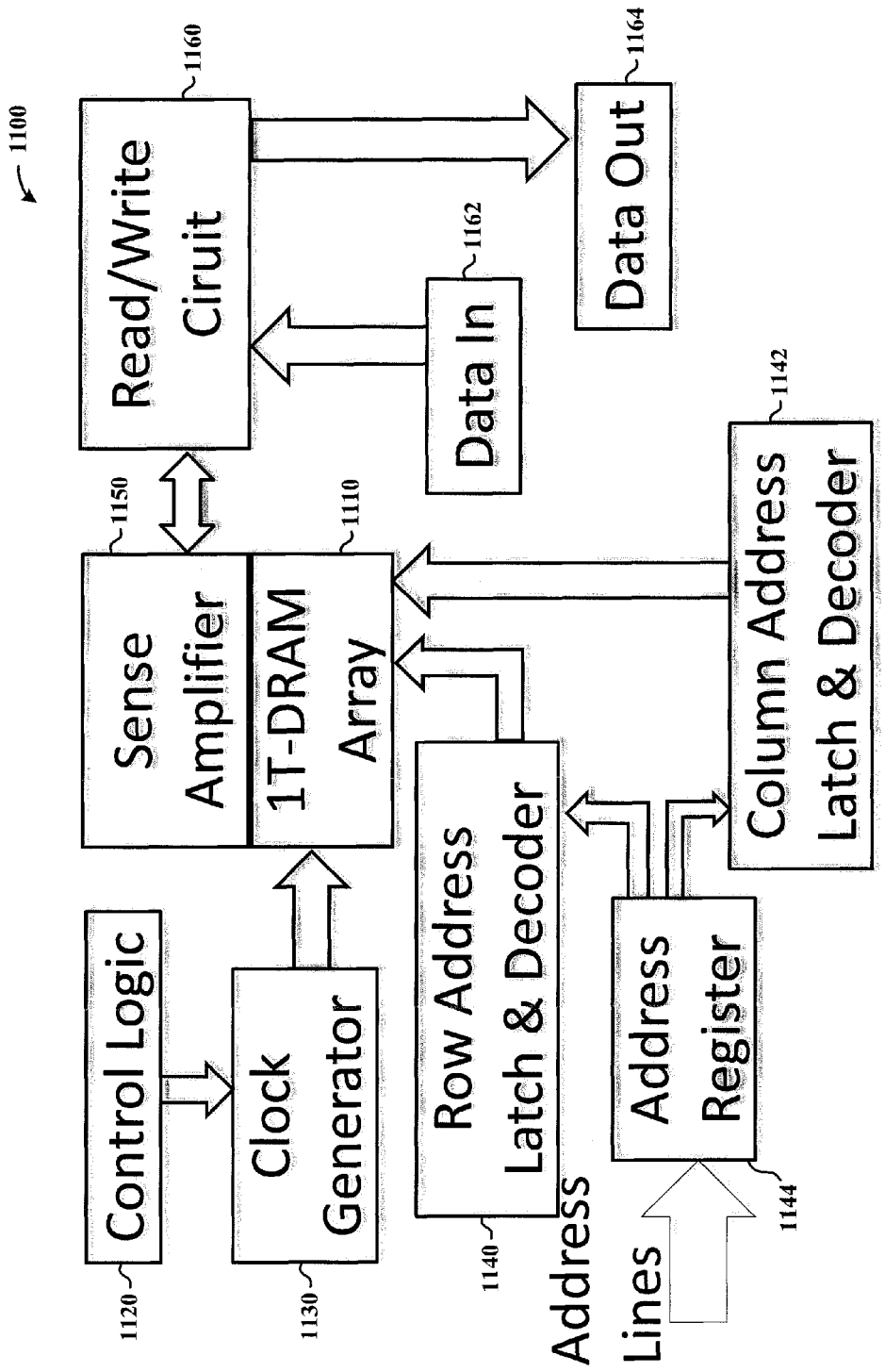
FIG. 11 shows a memory system, in accordance with another example embodiment of the present invention.

FIG. 11 shows a memory system 1100 having 1T-DRAM cells with channels to source/drain bandgap offsets, in accordance with another example embodiment of the present invention. The system 1100 includes a memory array 1110, implemented with a 1T-DRAM array such as shown in FIG. 10, and using 1T-DRAM cells such as those shown in FIGS. 1, 2, and described with FIGS. 8 and 9. In addition to the memory array 1110, the system 1100 includes control logic 1120 and a clock generator 1130 that control the memory array. Row address latch and decoder 1140 and column address latch and decoder 1142 are also coupled to the memory array 1110, and responsive to address lines received at an address register 1144. The memory array 1110 is connected to a sense amplifier 1150, for communicating to a read/write circuit 1160 having data input 1162 and data output 1164.

Other embodiments are directed to methods of manufacturing a semiconductor apparatus. A source-drain material layer is formed on a channel material and the source-drain material is configured with at least one of a conduction or valence band offset relative to the channel material to confine carriers in the channel region via respective bandgap offsets between the channel region and each of the source and drain regions. Such a channel region may, for example, be formed by forming a fin extending laterally on a substrate. The source-drain material layer is patterned or otherwise formed in separate source and drain regions, with the channel material being exposed. A dielectric layer is formed on the exposed channel material layer, and electrodes are formed on the source region, drain region and on a gate dielectric.

In some implementations, the thickness of the source-drain layer is selected and formed based on a critical thickness given by a lattice mismatch between the source-drain material and the channel material and forming the source-drain material layer to the selected thickness. This critical thickness involves a thickness that is about a thickness at which the lattice structure of the source-drain material and the channel materials is about equal.

In certain implementations, the channel material is formed by forming first, second and third layers of channel material in which the second layer is formed on the first layer, and the third layer is formed on the second layer. The second layer is of a material having at least one of a conduction or valence band offset relative to the first and second layers.

Figure 12:
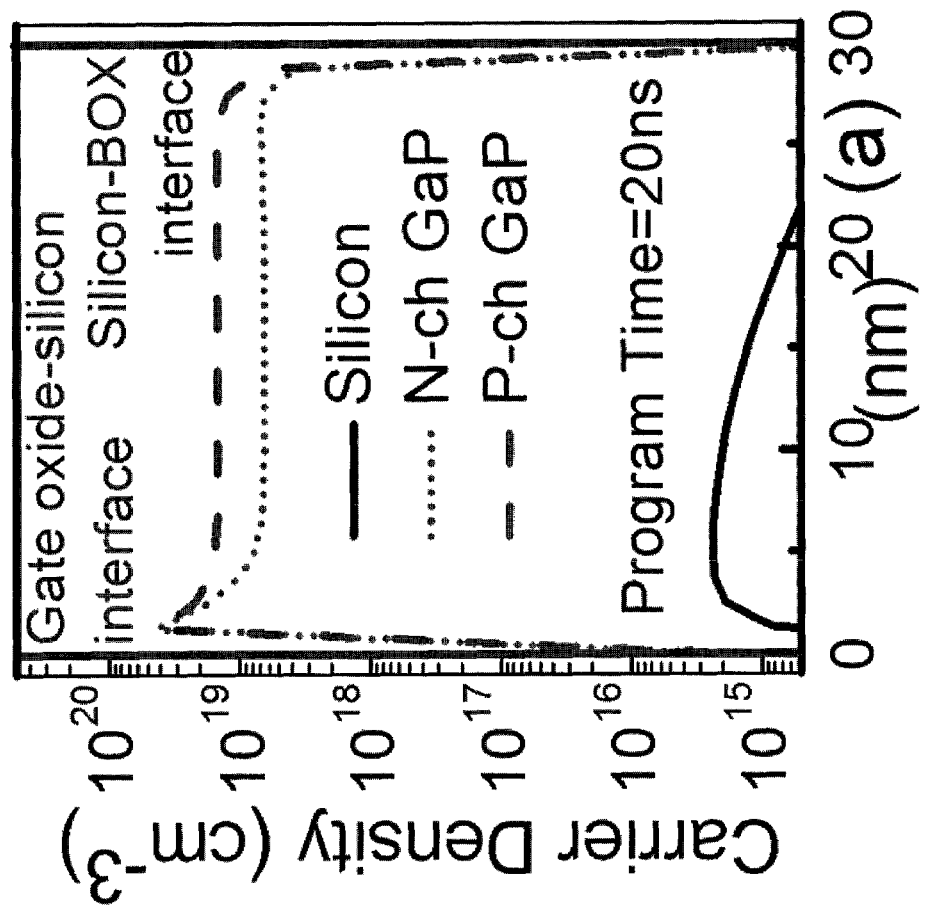
FIG. 12 shows operational characteristics of an apparatus, as may be relevant to one or more example and/or experimental embodiments of the present invention.

FIG. 12 shows operational characteristics of an apparatus as may be implemented in accordance with one or more example and/or experimental embodiments of the present invention. The figure shows confinement of stored charge in a transistor body, which facilitates read sensing current and hence higher retention time. The figure shows example operation of an apparatus using GaP (higher band gap material) at a source and drain to confine impact-ionization generated carriers effectively inside a transistor body. Carrier densities (holes for N-channel, electron for P-channel) are shown in the direction denoted by an arrow with respect to the figures and the device structure.

Figure 13:
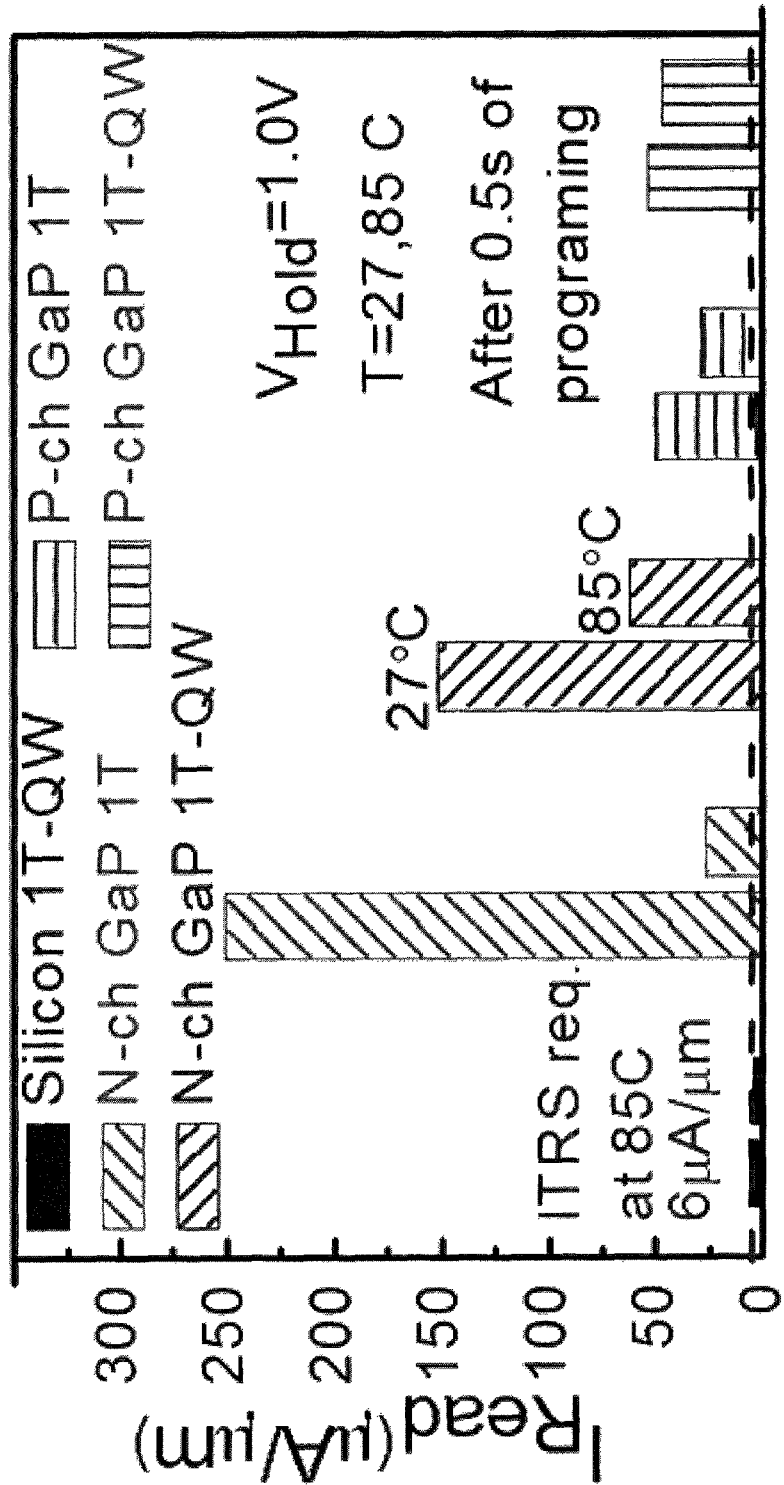
FIG. 13 shows operational characteristics of an apparatus, as may be relevant to one or more example and/or experimental embodiments of the present invention.

FIG. 13 shows operational characteristics of an apparatus, as may be relevant to one or more example and/or experimental embodiments of the present invention. Read current is shown for different combinations of channel and source/drain materials a respectively represented at different temperatures of 27 degrees Celsius and 85 degrees Celsius (left to right).

Figure 14:
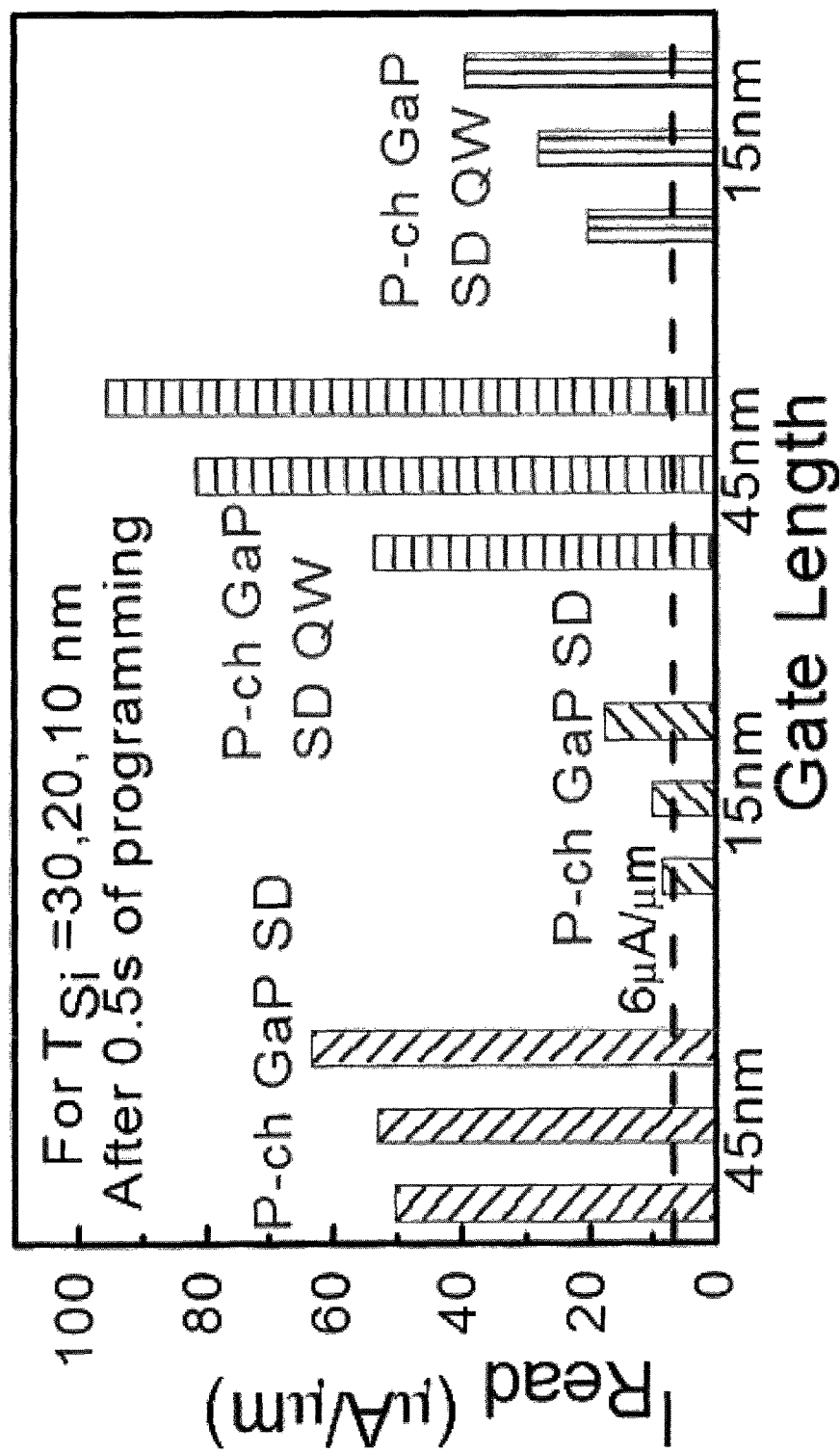
FIG. 14 shows operational characteristics of an apparatus, as may be relevant to one or more example and/or experimental embodiments of the present invention.

FIG. 14 shows operational characteristics of an apparatus as may be relevant to one or more example and/or experimental embodiments of the present invention. Relative to certain scaling considerations of 1T-DRAM, sizing can be pushed up to and/or beyond 15 nm reasonably well using high-bandgap material at source and drain regions. Read current is shown for different combinations of channel and source/drain materials respective silicon (channel) thicknesses of 30, 20, and 10 nanometers, respectively (left to right). Hash marks used in FIG. 14 correspond to those used and identified in FIG. 13.

Experimental/More-Detailed Embodiments

This section is directed to certain experimental/specific example embodiments in which silicon substrates are used. With silicon as channel, in many applications GaP can be an ideal material of choice for source and drain because of marginal lattice mismatch (0.37%) and valence band offset to store holes. The main challenge to develop this technology is to grow good quality GaP on silicon, preferably on substrates since it is widely used in manufacturing. The GaP—Si heterointerface must be almost free of defects as these defects may act as recombination centers for the stored charge inside the silicon body.

Due to polar nature, III-V materials' growth on silicon or germanium (group IV materials) is often challenging. The nucleation phase of III-V material may give rise to bonds between two group-III or two group-V atoms. These bonds between similar atoms are metallic in nature and act as a boundary between two single-crystalline domains opposite in phase. These are commonly referred to as antiphase boundaries and domains (APBs and APDs). As a consequence, optimization of growth of GaP on silicon is important to reduce the APDs and APBs. Also, MOCVD (metalorganic chemical vapor deposition) can be preferred over MBE (molecular beam epitaxy) in industry because of higher throughput and easier system maintenance. Consistent therewith, in the following discussion, a MOCVD technique is used to facilitate the optimization of growth of the GaP on silicon.

For these experiments, the starting substrate is highly resistive p-type silicon with (100) orientation. The substrate is introduced into a dry cleaning chamber without any pre-wet-clean process. After the dry cleaning step, the wafer is transferred to the MOCVD chamber without breaking the vacuum. For the optimized sample, the growth temperature is about 650° C. The growth thickness is kept limited to about 40-60 nm so that it does not exceed the reported critical thickness of 90 nm.

FIGS. 15($a$) and 15($b$) are graphs showing optimization of a MOCVD recipe by X-ray diffraction characterization of GaP film grown on <1 0 0> Silicon. FIGS. 15($a$)-15($b$) compare the orientation and crystalline quality of the GaP film using high resolution $\omega$-2$\theta$ scans along <004> and <002> directions for different process conditions. The peaks and their positions in the <004> $\omega$-2$\theta$ scan provide information about strain and lattice parameter (therefore about the crystal quality). In the <002> $\omega$-2$\theta$ scan, the peak occurs from ordering of Ga and P atoms only, but not due to silicon atoms. Any irregularity in ordering of Ga or P atoms (as introduced by anti-phase boundaries) broadens the <002> peak, so the presence of antiphase domains can be quantized by the full width at half maximum (FWHM) in <002> scan. The <004> scan in FIG. 15($a$) shows that the optimized GaP film (sample A) has a peak to the left of the more prominent silicon substrate peak. The separation of the GaP and silicon peak indicates that the optimized film is pseudomorphically strained with silicon, ensuring good crystal quality. For the non-optimized sample B (grown at a lower temperature), the GaP peak coincides with the silicon peak, indicating the absence of the strain for this film. The unoptimized sample C (grown with a difference V:III ratio from the optimized one) also shows presence of the strain in the film by the peak separation.

For an ideal silicon substrate, theoretically there should be no <002> peak due to symmetry restrictions. However presence of few impurities, defects or faults can result in a ghost silicon peak as captured in FIG. 15B. The GaP peak for the sample A to the left of the silicon peak ensures the optimized film quality whereas for sample B, the GaP peak almost coincides with the silicon one. Also compared to the unoptimized sample C, the FWHM of the peak is lower for sample A, which emphasizes the lower APB density for this sample.

Figure 16:
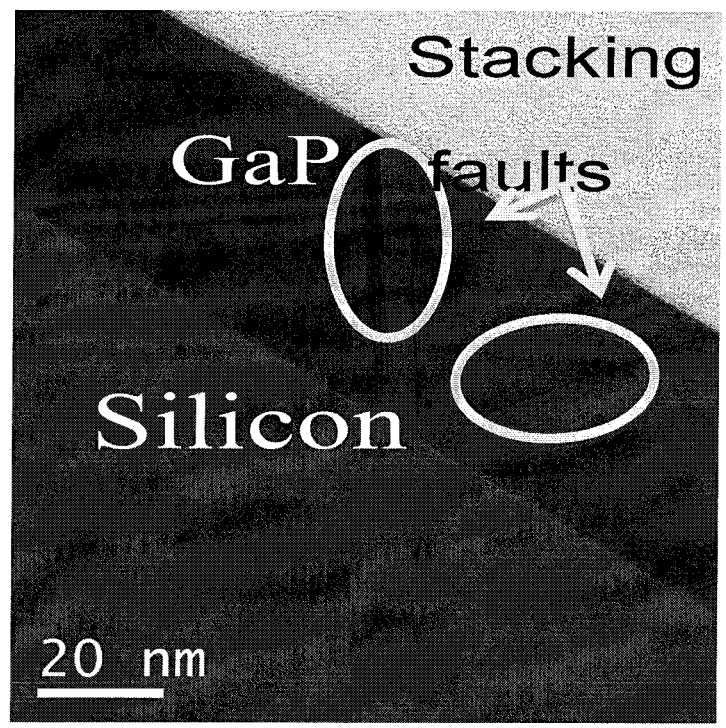
FIG. 16 shows reproductions of cross-section TEM images of an optimized sample A showing an abrupt interface between GaP and silicon with presence of stacking faults.

Cross-sections obtained from transmission electron microscopy (TEM) were used to characterize the interface and crystal quality of the optimized recipe. The stacking faults between two atomic planes generally show up at an angle to the growth direction whereas the anti-phase boundary propagates perpendicular to the interface or forms a triangular shaped region. FIG. 16 depicts a reproduction of cross-section TEM images of an optimized sample A showing an abrupt interface between GaP and silicon with presence of stacking faults. FIG. 16 displays the cross-section TEM of sample A with clear presence of stacking faults. This may be due to unoptimized growth or thickness of nucleation layer. However, no faults perpendicular to the interface layer are observed in the TEM image suggesting low density of <110> anti-phase boundaries. Absence of any triangular regions at the interface also suggests scarcity of <111> antiphase domains. Though stacking faults exist near the GaP—Si interface, we will show by electrical characterization that the electrical device performance does not degrade due to the presence of these stacking faults.

Electrical characterization of the GaP—Silicon Heterojunction

The effect of defects present at any heterojunction interface can be well characterized by making a heterojunction diode. The reverse leakage current degrades with the number of interface defects and increases with reverse voltage due to enhanced recombination and tunneling through traps. So p-n diodes using the p-type Si substrate as cathode and n-type MOCVD grown GaP as anode are used to characterize the GaP—Si interface. First, the GaP surface is cleaned using 2% hydrofluoric acid (HF). An acid mixture of HCl, nitric acid (HNO₃) and acetic acid (CH₃COOH) is used to etch the GaP layer. The sample is then introduced into an ALD chamber to deposit aluminum oxide (Al₂O₃) for isolation. Finally the sample is patterned again to form the anode and cathode contact holes. An alloy of nickel, silicon and gold is deposited as contact metal using an e-beam metal evaporation system.

Figure 17:
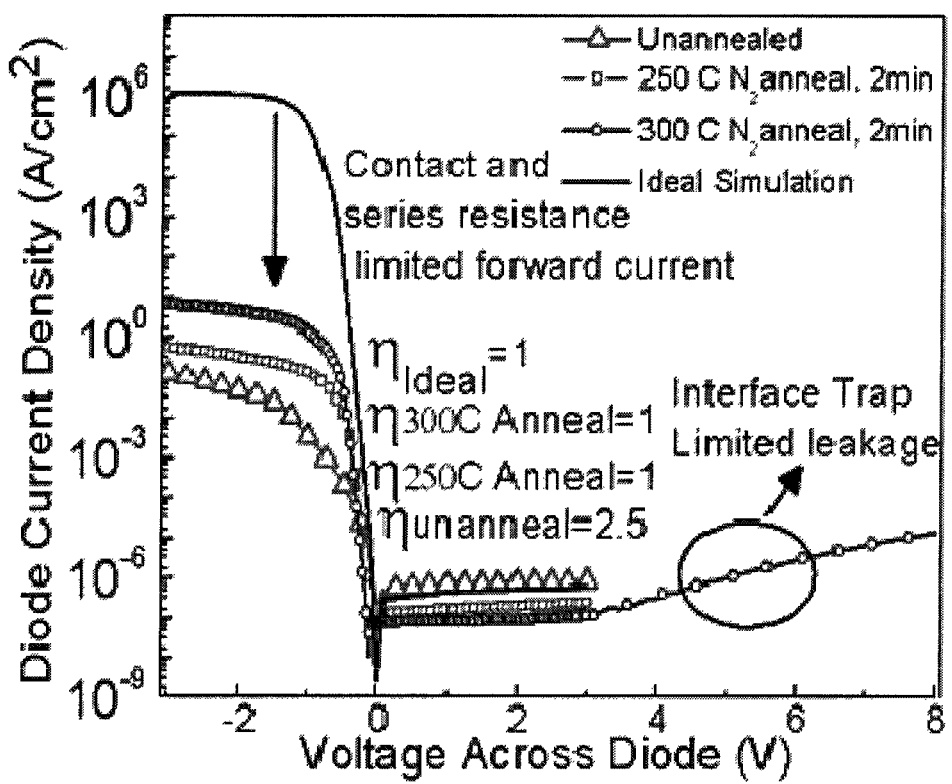
FIG. 17 is a graph showing characterization of diode-current density to voltage for a GaP—Si heterojunction diode consistent with the instant disclosure.

FIG. 17 is a graph showing characterization of diode-current density to voltage for a GaP—Si heterojunction diode consistent with the instant disclosure. The illustrated characterization of GaP—Si heterojunction diode shows close-to-ideal OFF-current at low reverse voltage. The ideality factor is also close to 1. The forward current is much lower than the ideal forward-current because of the series resistance due to lightly doped silicon. With higher reverse voltage, diode current starts to increase due to tunneling across the interface.

The I-V characteristics of the GaP—Si heterojunction diode are shown in FIG. 17 and also compared with the simulation result of an ideal GaP—Si diode of the same doping concentration levels. Without any annealing, the ideality factor and the ON-current of the diode are poor. This is due to the higher contact resistance at both GaP and Si contacts since the doping concentrations in both GaP and Si are low. However the OFF-current is of the same range as that of obtained from the ideal device simulation. This proves that even with existing stacking faults or twins near the GaP—Si interface (as can be seen in TEM cross-section), the reverse leakage current has not degraded. In other words, the growth recipe has been optimized sufficiently for transistor and memory application in today's semiconductor industry. The ideal device simulation results (considering ideal interface and zero contact and series resistance) show that the reverse current is limited mainly by Shockley-Read-Hall (SRH) generation in the P-N junction depletion region that is mostly extended in the lightly doped P-type silicon. The sample is then annealed in a rapid thermal annealing chamber in N₂ environment at 250° C. or 300° C. for 2 mins. With annealing, both the ideality factor and the ON-current improve. An ON-to-OFF ratio of almost $10^8$ is obtained from the fabricated diode at ±3V. The ideality factor of the diode is almost 1 and matches with the ideal device simulation results. The ON-current from the fabricated diodes is almost 5 orders lower from the simulated result which is due to series resistance from the silicon substrate and contact resistance due to light doping in silicon. At a higher reverse voltage (>3V) the OFF-current starts to increase again. However the rate of the increase in current is much lower than expected in an avalanche breakdown case. The increase in the current is either due to the trap assisted or band-to-band tunneling across the PN-junction.

Figure 18:
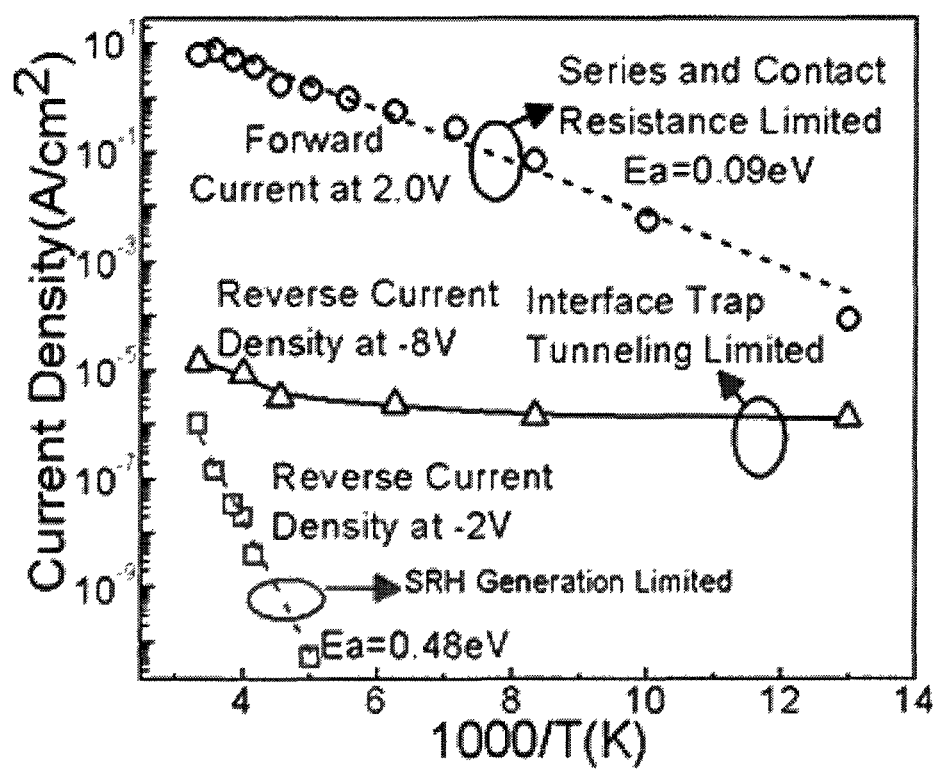
FIG. 18 is a graph showing temperature dependent measurement of a GaP—Si diode current at reverse and forward voltage bias.

FIG. 18 is a graph showing temperature-dependent measurement of a GaP—Si diode at reverse and forward current. Weak dependence of forward current to temperature ensures that it is limited by series resistance and mobility. At −2V reverse voltage, the activation energy of the reverse current temperature dependence is about 0.48 eV, which is much closer to the half of the silicon bandgap. However at −8V, the temperature dependence of the reverse current is much weaker signifying that at higher reverse voltage, the diode current is dominated by tunneling.

As discussed above, FIG. 18 shows the temperature dependence of the forward and reverse current of the GaP—Si diode. Interface defects tend to freeze at lower temperature and if limited by these defects, then the reverse leakage current tend to reduce quickly with temperature. On the other hand for reverse current limited by SRH generation, it generally has a temperature dependence of $E_G/2$. In FIG. 18, the reverse current is extracted at 2V and 8V. The reverse current extracted at 2V has activation energy of 0.48 eV, which is quite close to the half of the bandgap ($E_G$) of silicon. Thus it is evident that the reverse current of these diodes at low voltage is limited by SRH generation as in the case of an ideal diode. This is extremely important as either the SRH generation or interface trap leakage/recombination will determine the retention time for 1-transistor DRAM application. The SRH dependence leakage current signifies that the 1T-DRAM retention time will be close to the ideal simulated one. The weaker temperature sensitivity of the reverse current extracted at −8V indicates tunneling as the current conduction mechanism at higher reverse voltages.

GaP source-drain transistor is a key component for both 1-Transistor DRAM and logic transistor application. It is important to evaluate the GaP—Si interface in light of transistor performance since that is another goal for developing this technology. A gate last process is used for transistor fabrication (the same process flow as described in FIG. 6 in the application but on bulk silicon). After the MOCVD growth, the GaP is patterned and etched to form source and drain and to expose the silicon underneath the etched GaP to subsequently form the gate stack on top of it. Since the top silicon surface may be defective after the growth of GaP, it is important to etch a few nm of silicon also to have a good surface quality. The silicon etching is followed by atomic layer deposition (ALD) of gate oxide (aluminum oxide in this case) at 300° C. at almost 1 Å/cycle rate. After gate oxide formation, aluminum is deposited and patterned to form the gate electrode. Finally the source-drain contact holes are opened and Au—Si—Ni metal combination is deposited using e-beam evaporator. This process flow gives rise to large drain-gate and source-gate overlap; in one contemplated embodiment for the fabricated transistors, this overlap is about 2 μm.

Figure 19:
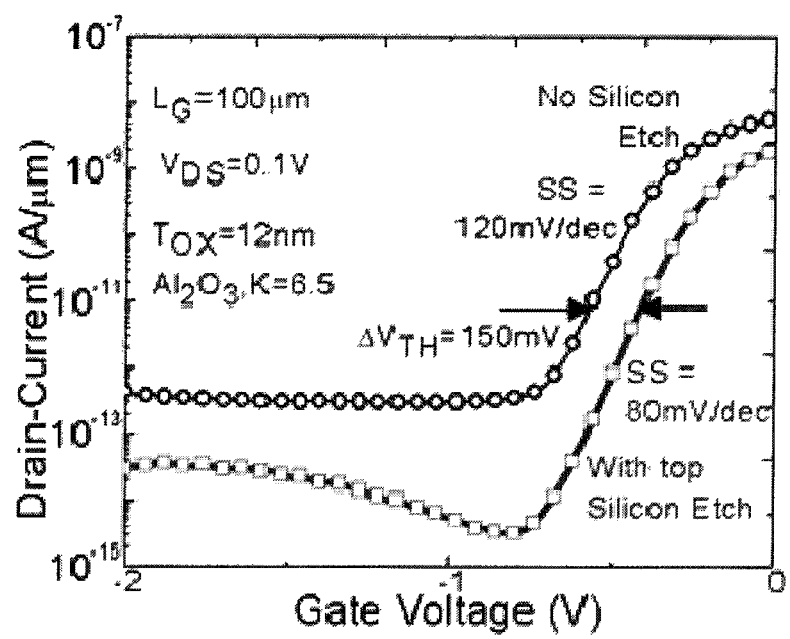
FIG. 19 is a graph showing characterization of drain current versus gate voltage for illustrating the effect of top silicon surface etching before gate oxide deposition on the transfer characteristics.

FIG. 19 is a graph depicting characterization of drain current versus gate voltage for illustrating the effect of top silicon surface etching before gate oxide deposition on the transfer characteristics. As shown in this figure for this effect, both OFF-current and subthreshold swing improves with etching of the top silicon surface. Also the threshold voltage is different for two cases due to dopant diffusion into silicon during GaP MOCVD growth.

With regards to FIG. 19, the transfer characteristics of the transistor demonstrate that without the silicon etch, the OFF-current is almost one order higher than the sample with the silicon etch. The threshold voltages also in these two cases are different as the top silicon surface seems to have a lower P-type concentration. So we conclude that to have a better control on threshold voltage and to improve the OFF-current of the transistors, it is important to etch the top defective surface of the silicon. However, the ON-current also seems to degrade slightly which might be due to the degradation of mobility at increased surface roughness after the silicon etching.

Figure 20:
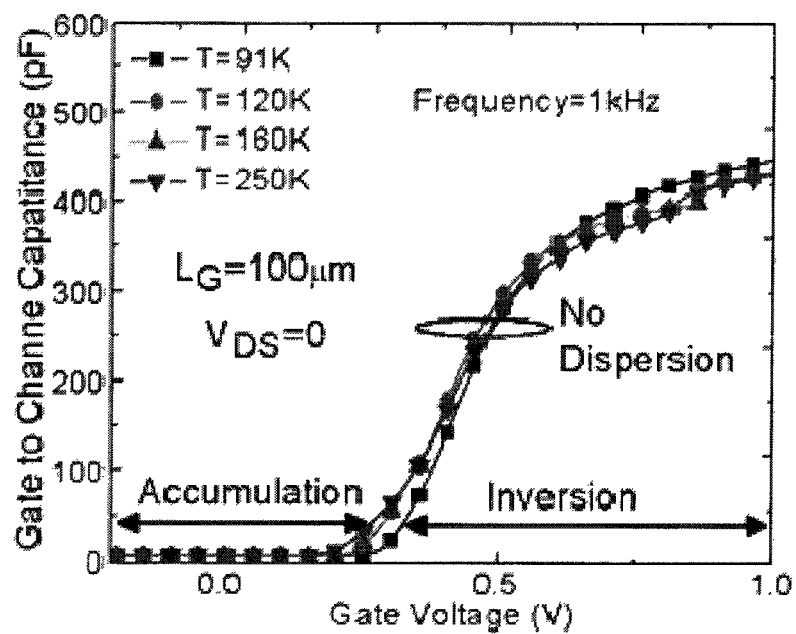
FIG. 20 is a graph showing measurement of gate-to-channel capacitance over a large temperature range.

FIG. 20 is a graph showing measurement of gate-to-channel capacitance over a large temperature range. As illustrated, measurement of gate-to-channel capacitance over a large temperature range (with source and drain shorted) at low frequency does not show much dispersion. This indicates good quality of the gate oxide and minimal effect of the interface states density. With regard to silicon etching of the preceding paragraph, FIG. 20 shows that even at low temperatures, there is not much dispersion in the gate-channel capacitance (measured by shorting source and drain and at low frequency, where the interface traps are supposed to respond more). This indicates high quality of the gate oxide formed on silicon after the etching of the top surface of silicon.

Figure 21A:
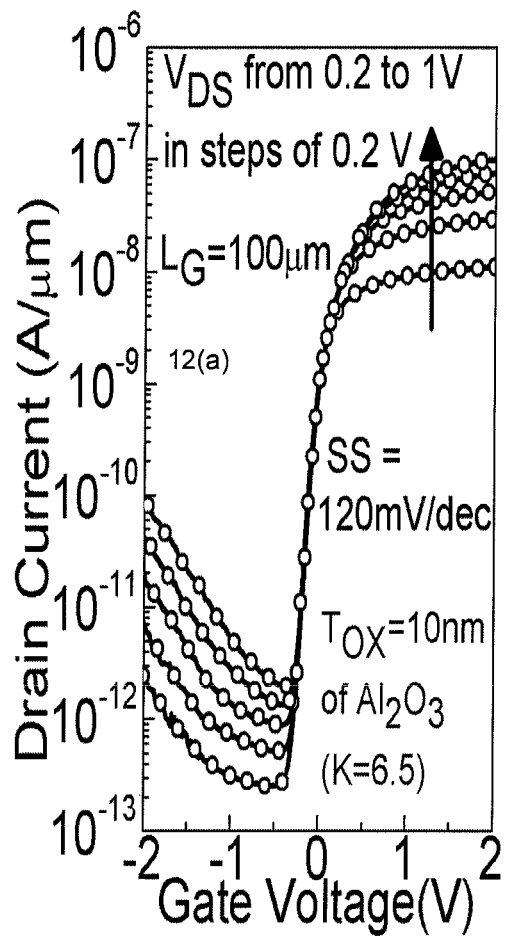
FIGS. 21(a) and 21(b) are graphs showing, respectively, (a) transfer and (b) output characteristics of the GaP source-drain transistors.
Figure 21B:
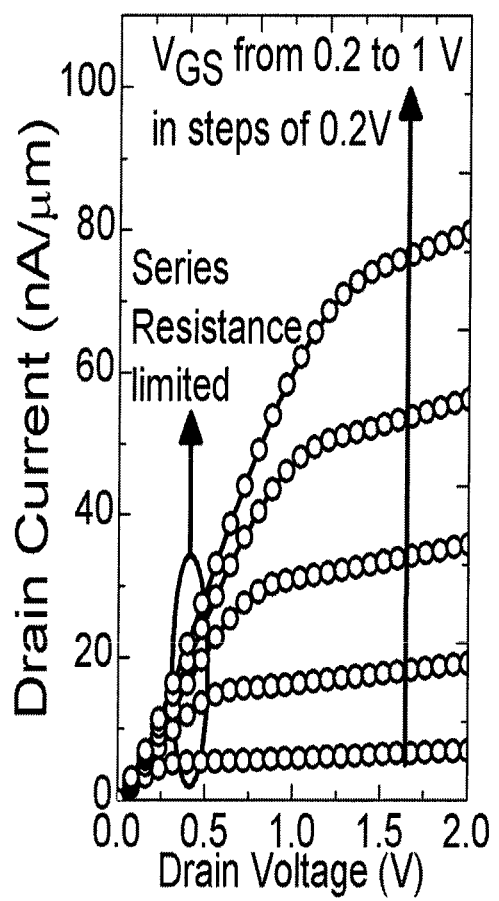

FIGS. 21(a) and 21(b) are graphs showing, respectively, (a) transfer and (b) output characteristics of the GaP source-drain transistors. In the transfer characteristics of FIG. 21(a), the OFF-current increases with reverse gate voltage because of the gate induced drain leakage (GIDL) due to large gate-drain overlap. The ON-current is limited by the source/drain series resistance. In the output characteristics of FIG. 21(b), due to high source-drain resistance, the currents at low drain voltage for different gate voltages are much closer to each other. Good saturation was obtained in the output characteristics as expected for long channel transistors. In this regard, FIGS. 21(a) and 21(b) show the transfer and output characteristics of a GaP source-drain silicon transistor with 100 µm gate length. In the transfer characteristics, the OFF-current increases with negative gate voltage. This OFF-current is dominated by GIDL which is the signature of devices with high gate-drain overlap. An $I_{ON}$ to $I_{OFF}$ ratio of $10^5$ is obtained at 100 µm gate length. In the output characteristics at low drain voltages, the drain current clearly shows signature of getting limited by source and drain resistance. This was expected as the source and drain were not intentionally doped which limits the ON-current due to high source and drain resistance. Reasonable saturation in drain current was also achieved at higher drain voltages. This suggests that with using SOI substrates for growth and with incorporation of dopants in the GaP film, the GaP-source drain 1T-DRAM memory cell can be easily realized.

Based upon the above discussion and illustrations, those skilled in the art will readily recognize that various modifications and changes may be made to the present invention without strictly following the exemplary embodiments and applications illustrated and described herein. For example, various transistors may be implemented with differently-doped substrates, and with a variety of different types of circuits, including circuits that may be implemented in addition to, or as an alternative to, memory circuits. In addition, various materials may be used to implement band offsets relative to the confinement of hole carriers and electron carriers, to suit particular applications (e.g., those embodiments described in connection with the storage of hole carriers may be implemented with different materials to effect the confinement of electron carriers). Such modifications do not depart from the true spirit and scope of the present invention, including that set forth in the following claims.

What is claimed is:

1. An apparatus comprising:
    a front gate;
    a channel region below the front gate;
    a first gate dielectric between the front gate and the channel region;
    a second gate dielectric below the channel region;
    a back gate below the channel region and separated from the channel region by the second gate dielectric;
    a raised source region having respective portions laterally adjacent the front gate and adjacent the channel region; and
    a raised drain region having respective portions laterally adjacent the front gate, the source and drain regions being configured and arranged with the channel region to confine carriers in the channel region via respective bandgap offsets between the channel region and each of the source and drain regions.

2. The apparatus of claim 1, wherein
    each of the source and drain regions exhibit a valence band that is offset from a valence band of the channel region, and
    the source, drain and channel regions are configured and arranged to store hole-based charge carriers in the channel region via the respective valence band offset.

3. The apparatus of claim 1, wherein
    each of the source and drain regions exhibit a conductance band that is offset from a conductance band of the channel region, and
    the source, drain and channel regions are configured and arranged to store electron-based charge carriers in the channel region via the respective conductance band offset.

4. The apparatus of claim 1, wherein
    each of the source and drain regions exhibit a valence band that is offset from a valence band of the channel region, and a conductance band that is offset from a conductance band of the channel region, the channel region having a bandgap that is smaller than a bandgap of the respective source and drain regions, and
    the source, drain and channel regions are configured and arranged to store hole-based charge carriers in the channel region via the valence and band offsets, and to store electron-based charge carriers in the channel region via the conductance band offset.

5. The apparatus of claim 4, wherein
    the channel region includes a silicon-based material, and
    the source and drain regions include a gallium phosphide-based material that forms an interface with the silicon-based material.

6. The apparatus of claim 1, wherein
    the channel region includes first and second layers separated by a third layer, the third layer having a bandgap that is smaller than a bandgap of the first and second layers and having at least one of a valence band and a conductance band offset relative to the first and second layers, and
    the first, second and third layers are configured and arranged to store at least one of hole-based charge carriers and electron-based charge carriers in the third layer, via the respective band offsets.

7. The apparatus of claim 6, wherein the first, second and third layers are lattice-matched with each other at respective interfaces.

8. The apparatus of claim 6, wherein
    the first and second layers include a silicon-based material and the third layer includes a silicon germanium-based material $Si_{1-x}Ge_x$ in which x is between 0 and 1, and
    the source and drain regions include a gallium phosphide-based material that forms an interface with the silicon-based material.

9. The apparatus of claim 1, wherein the source and drain regions are lattice-matched with the channel region at respective interfaces between the source and drain regions and the channel region.

10. The apparatus of claim 1, wherein
    the first gate dielectric is on an upper surface of the channel region, and
    all of the raised source and raised drain regions are laterally adjacent the front gate and over the upper surface of the channel region, the channel region extending laterally below the front gate and each of the raised source and drain regions.

11. The apparatus of claim 1, wherein
the channel region is a fin-type region extending laterally on a substrate, and
the raised source and drain regions are over and wrapped around respective ends of the channel region.

12. A memory array apparatus comprising:
a plurality of carrier confinement regions, each carrier confinement region including first, second and third regions, the third region being electrically between the first and second regions and having a material exhibiting a bandgap that is different than respective bandgaps of materials of the first and second regions, each carrier confinement region configured to store data in the form of charge carriers via the respective bandgaps of the first, second and third regions;
for each carrier confinement region, first and second gate structures each having a gate electrode and dielectric between the gate electrode and carrier confinement region, each gate structure being configured and arranged to apply a bias to the carrier confinement region for storing and depleting the charge carriers therein; and
a raised source region including at least a portion of the first region adjacent the first gate structure; and
a raised drain region including at least a portion of the second region adjacent the first gate structure.

13. The apparatus of claim 12, wherein the memory array includes a plurality of memory cells, each memory cell including one of the carrier confinement regions in which the third region is a channel region of a transistor that stores data in the form of the charge carriers, the transistor including the raised source and drain regions respectively including the first and second regions.

14. The apparatus of claim 12, wherein the memory array is a dynamic random access memory (DRAM) including a plurality of memory cells, each memory cell including one of the carrier confinement regions, each carrier confinement region being configured and arranged to store carriers inside the third region based upon a threshold voltage of the gate electrode in the first gate structure.

15. The apparatus of claim 12, further including a wafer die having a CPU and a dynamic random access memory (DRAM) including a plurality of memory cells, each memory cell including one of the carrier confinement regions, each carrier confinement region being configured and arranged to store carriers inside the third region based upon a threshold voltage of the gate electrode in the first gate structure.

16. The apparatus of claim 12, wherein each carrier confinement region is configured to store the data in the form of charge carriers via the respective bandgaps of the first, second and third regions, by using a bandgap offset between the raised source region and a channel region that includes at least a portion of the third region, and using another bandgap offset between the raised drain region and the channel region, to confine the charge carriers in the channel region.

* * * * *